United States Patent [19]
Mauthe

[11] Patent Number: 4,987,383
[45] Date of Patent: Jan. 22, 1991

[54] INTEGRATED COMPRESSION AMPLIFIER HAVING PROGRAMMABLE THRESHOLD VOLTAGE

[75] Inventor: Manfred Mauthe, Munich, Fed. Rep. of Germany

[73] Assignee: Siemens Aktiengesellschaft, Berlin and Munich, Fed. Rep. of Germany

[21] Appl. No.: 412,166

[22] Filed: Sep. 25, 1989

[30] Foreign Application Priority Data

Oct. 13, 1988 [DE] Fed. Rep. of Germany ....... 3834928

[51] Int. Cl.⁵ .............................................. H03G 3/30
[52] U.S. Cl. .................................... 330/279; 330/254; 330/280
[58] Field of Search ................ 330/129, 138, 254, 279, 330/280; 381/106-108

[56] References Cited

U.S. PATENT DOCUMENTS 3,719,895 3/1973 Van Der Puije ................... 330/280

OTHER PUBLICATIONS

"Improved Offset-Compensation Schemes for Switched-Capacitor Circuits", by G. C. Temes et al., Electronic Letters, vol. 20, No. 12, Jun. 7, 1984, pp. 508–509.

"Get Gain Control of 80 to 100 dB", W. G. Jung, Electronic Design 13, Jun. 21, 1974, pp. 94–99.

"High Voltage Gain CMOS OTA for Micropower SC-Filters", by F. Krummenacher, Electronic Letters, Feb. 19, 1981, vol. 17, No. 4, pp. 160–162.

*Primary Examiner*—James B. Mullins
*Attorney, Agent, or Firm*—Hill, Van Santen, Steadman & Simpson

[57] ABSTRACT

An integrated compression amplifier that can be constructed in CMOS technology and whose threshold voltages are programmable. The compression amplifiers can be built into a multi-channel AGC device, so that the circuit can be co-integrated on a "switched capacitor" filter chip in CMOS technology. The compression amplifier circuit essentially involve a feedback amplifier whose gain is controlled by the output amplitude. To this end, an amplifier SC having variable gain constructed as a "switched capacitor" amplifier, a rectifier unit GR' as well as a low-pass filtr TP' are in a feedback branch and a two quadrant multiplier ZM1 is connected between the input and output Ue', Ua' of the compression amplifier. The output of the lo-pass filter TP' is thereby fed back onto the control input of the two quadrant multiplier ZM'.

39 Claims, 10 Drawing Sheets

INTEGRATED COMPRESSION AMPLIFIER HAVING PROGRAMMABLE THRESHOLD VOLTAGE

BACKGROUND OF THE INVENTION

The present invention is directed to an integrated compression amplifier having programmable threshold voltage. The compression amplifier is of the type having a two quadrant multiplier and a feedback branch that contains a rectifier unit and a following low-pass filter, whereby either the feedback branch or one output of the low-pass filer is fed back onto the two quadrant multiplier. The two quadrant multiplier with a preceding voltage divider is connected between an input and an output of the compression amplifier.

Hearing impairments wherein the dynamic range is limited are referred to as recruitment. This impairment can be compensated with a circuit that controls the gain. An automatic gain control circuit is required for this purpose or, more precisely, a compression amplifier. FIG. 1 is a graph of the hearing and pain threshold of a person with normal hearing as well as of a hearing-impaired person. Therein, the frequency f in Hz is entered on the abscissa and the acoustic pressure level in dB is entered on the ordinate. For a person having normal hearing, the dynamic range begins at the normal hearing threshold NH and ends with the normal pain threshold NS, whereas the restricted dynamic range of recruitment lies between the pathological hearing threshold PH and the pathological pain threshold PS. The pathological hearing threshold thus lies above the normal hearing threshold. In such a case, the sounds that are still perceived by a person with normal hearing are no longer heard. If the pain limit remains approximately the same, the dynamic range is limited when compared to the normal or, expressed in other terms, the normal dynamic range of speech is compressed onto the pathological dynamic range of the hearing-impaired person. In order to compensate the recruitment and in order to provide the impaired person with the impression of a person with normal hearing, quiet sounds must be amplified by a high amount and louder sounds must be amplified by a lower amount up to the hearing threshold. An amplitude-dependent gain required for this purpose is achieved with a compression amplifier. These are utilized in hearing aids in order to compensate the recruitment. The gain in a compression amplifier is constant up to a variable threshold. The gain decreases for input levels that lie above the threshold. The compression ratio $K_v$ is the quotient of output level change relative to input level change. The compression ratio usually lies between 1/5 and 1/12. The compression characteristic of the compression amplifier exhibits the constant gain 1 up to a variable threshold. The compression begins above this threshold and the gain, defined as $$V_u(U_e) = (U_e/U_{eth}) = (1 - K_v)$$

where $U_e$ equals input voltage and $U_{eth}$ equals a variable threshold voltage, which decreases with a hyperbolic curve.

Compression amplifiers for low supply voltages in bipolar technology are known in the prior art, whereby feedback amplifiers are essentially used whose gain is controlled by an output amplitude. FIG. 2 shows a block circuit diagram of such a prior art amplifier. The output amplitude is identified with a detector and the control voltage is generated by a low-pass filter. The input signal is multiplied by the gain dependent on the control voltage in a two quadrant multiplier. Two quadrant multipliers in bipolar technology may be found in the publication by Jung, W. G., "Get Gain Control of 80 to 100 dB", Electronic Design 13, June 21, 1974, pages 9414 99. A transconductance amplifier according to FIG. 3 can be selected as a special realization of a two quadrant multiplier. Transconductance amplifiers in CMOS technique are known from the literature and are described in Krummenacher, F., "High Voltage Gain CMOS OTA For Micropower SC-Filters", Electronic Letters, Feb. 19, 1981, Vol. 17, No. 4, pages 160–162. When the input transistors operate in weak inversion that is equivalent to a boundary condition between inhibiting and conducting, then the gain of the transconductance amplifier can be varied proportional to the input current (bias current). In order to again have a voltage available as a signal at the output at the transconductance amplifier, the amplifier is terminated with a resistor Ra. Since the currents have a magnitude on the order of micro-amperes, the output resistor Ra is selected in the range 1–10 Mohm.

In the case of a hearing-impaired person, the dynamic range need not necessarily be limited over the entire audible frequency range. For example, a recruitment in the lower and upper frequency range is conceivable, whereas the dynamic range is not restricted in the middle frequency range. Multi-developed in order to better compensate such hearing impairments, whereby every channel is responsible for a defined frequency band. At present, a multi-channel AGC device in mixed technology (bipolar-CMOS technology) can be realized with a multi-chip circuit. Because of the space required, such a solution is not acceptable for a behind-the-ear device.

SUMMARY OF THE INVENTION

An object of the present invention is to provide a compression amplifier in CMOS technology that can be operated with low voltage and whose circuit can be integrated and, thus, requires optimally little space.

This object is inventively achieved by a compression amplifier having an amplifier with variable gain connected in a feedback branch between a rectifier unit and the output of the compression amplifier. The rectifier unit has a circuit for generating a bias voltage allocated to it. A reference current source is connected at a summation point between a low-pass filter and the rectifier unit. In another embodiment the low-pass filter is fed back onto the two quadrant multiplier via a voltage-to-current converter, the voltage-to-current converter having a reference voltage source allocated to it.

The advantage obtainable with the present invention is that the compression amplifier can be integrated on a chip together with a SC filter (switched capacitor filter) in CMOS technology and the possibility is thereby established of realizing a multi-channel AGC device. The threshold voltage with which the compression should begin is selectable in discrete stages in the compression amplifier of the present invention and is defined with a programming when the device is initialized.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
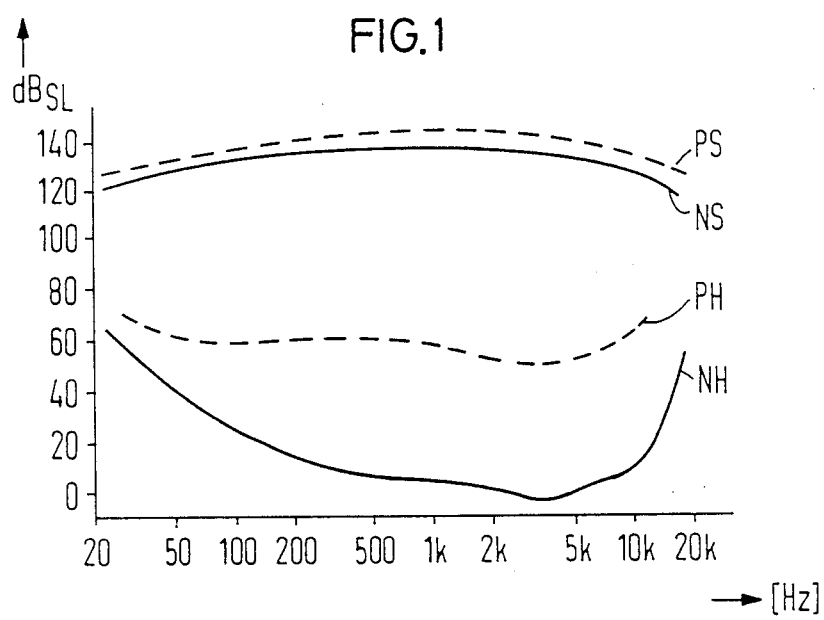
FIG. 1 is a graph of the hearing and pain threshold of a person with normal hearing and of a hearing-impaired person already set forth, over a frequency range of 20 Hz to 20 kHz.
Figure 2:
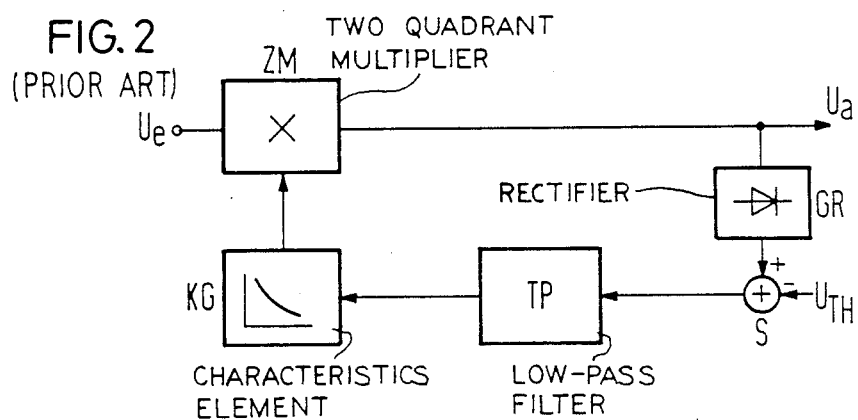
FIG. 2 is a block circuit diagram of a compression amplifier of the prior art.

FIG. 2 shows a compression amplifier of the prior art having a two quadrant multiplier ZM and a feedback branch. The two quadrant multiplier ZM is connected between the input and output $U_e$, $U_a$ of the compression amplifier, whereas the feedback branch is arranged between the output $U_a$ of the compression amplifier and a control input of the two quadrant multiplier ZM. The feedback branch contains a rectifier unit GR, a low-pass filter TP as well as a characteristics element KG. The output signal at the output $U_a$ of the compression amplifier is compared to a threshold voltage $U_{TH}$ at a summation point S via the rectifier unit GR. A signal thereby derived is supplied to the characteristics element KG via the low-pass filter TP as a control voltage. The required gain v is subsequently identified via the characteristics element KG and is fed back onto the two quadrant multiplier ZM. As may be seen in the characteristics element KG in FIG. 2, the gain characteristic has the initially cited hyperbolic curve that is intended to begin above the threshold voltage. When the rectified output signal of the compression amplifier does not reach the threshold voltage $U_{TH}$, then the compression amplifier supplies a gain of v=1, whereby the feedback via the feedback branch is ineffective. When the rectified output signal of the compression amplifier exceeds the threshold $U_{TH}$, the compression effect begins and the desired gain is set via the feedback branch.

Figure 3:
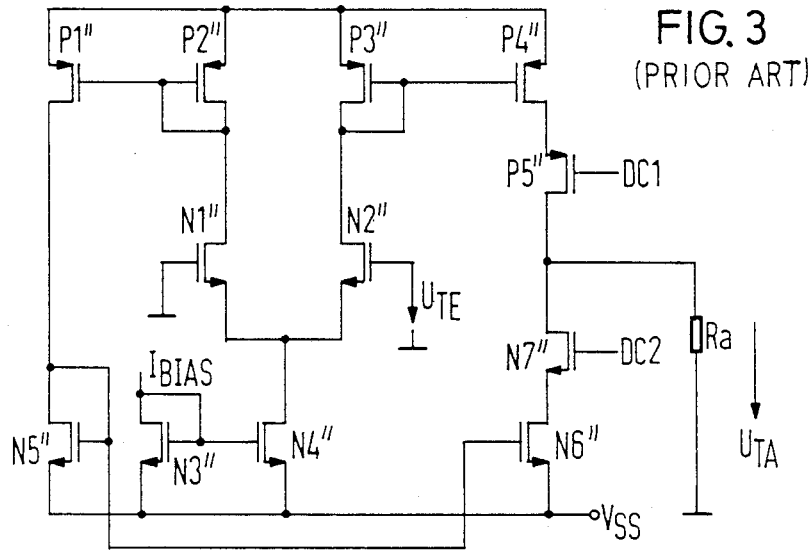
FIG. 3 is a transconductance amplifier of the prior art.

In a special realization, what is referred to as a transconductance amplifier can be utilized for a two quadrant multiplier, as shown, for example, in FIG. 3. For constructing this transconductance amplifier, a differentiating unit as well as four current mirror circuits are required. The first current mirror circuit is connected to the common, first terminal of the two n-channel field effect transistors N1", N2", whereas the remaining three current mirror circuits are arranged at the output of the differential amplifier. Two of the three current mirror circuits are connected in series at the output of the first n-channel field effect transistor N1", whereas the third current mirror circuit is connected at the output of the second n-channel field effect transistor N2". The two amplified current components from the differential amplifier are conducted to a common output via a respective p-channel and n-channel field effect transistor, whereby the output voltage $U_{TA}$ drops off via the connected output resistor Ra. As already initially recited, the output resistor $R_a$ is selected in the range from 1–10 Mohm, since the occurring currents have a magnitude on the order of microamperes.

In detail, the transconductance amplifier of FIG. 3 is constructed as follows. The two first terminals of the first and second n-channel field effect transistor N1", N2" are connected in common to the output of the first current mirror circuit that is constructed with a third and fourth n-channel field effect transistor N3", N4". Via the control input that is utilized as a feedback input according to the block circuit diagram of the compression amplifier in FIG. 2, the control current $I_{BIAS}$ is connected to the first terminal and to the gate terminal of the third n-channel field effect transistor N3" as well as to the gate terminal of the fourth n-channel field effect transistor N4". The second terminal of the third and fourth n-channel field effect transistor N3", N4" are connected to Vss, whereas the first terminal of the fourth nchannel field effect transistor N4" represents the output of the first current mirror circuit. The gate terminal of the first n-channel field effect transistor N1" in the circuit of FIG. 3 is connected to ground GND, whereas the input voltage $U_{TE}$ is applied to the gate terminal of the second n-channel field effect transistor N2". The second terminal of the first n-channel field effect transistor N1" that forms the first output of the differential amplifier is connected to the second current mirror circuit composed of the two p-channel field effect transistors P1", P2". To this end, the first terminal and the gate terminal of the second p-channel field effect transistor P2" as well as the gate terminal of the first p-channel field effect transistor P1" are connected in common to the first output of the differential amplifier, whereas the first terminal of the first p-channel field effect transistor T1" represents the output of the second current mirror circuit.

The second terminal of the second n-channel field effect transistor N2" of the differential amplifier is connected via the gate terminal of the third p-channel field effect transistor P3", the gate terminal of the fourth p-channel field effect transistor P4" as well as to the first terminal of the third p-channel field effect transistor P3", whereby the third and fourth p-channel field effect transistor P3", P4" form the third current mirror circuit. Further, the second and third current mirror circuit are connected to one another via the second terminal of the first and second pchannel field effect transistor P1", P2" and the second terminal of the third and fourth p-channel field effect transistor P3", P4", respectively. The output of the second current mirror circuit is connected to the fourth current mirror circuit composed of the fifth and sixth n-channel field effect transistor N5", N6". To this end, the output of the second current mirror circuit is interconnected to the first terminal and to the gate terminal of the fifth n-channel field effect transistor N5" as well as to the gate terminal of the sixth n-channel field effect transistor N6", whereas the second terminal of the fifth n-channel field effect transistor N5" and the second terminal of the sixth n-channel field effect transistor N6" are connected to $V_{ss}$.

The output of the fourth current mirror circuit that is formed with the second terminal of the sixth n-channel field effect transistor N6" is connected to the output of the transconductance amplifier via a seventh n-channel field effect transistor N5", whereas the output of the third current mirror circuit formed with the second terminal of the fourth p-channel field effect transistor P4" is likewise connected to the output of the transconductance amplifier via the fifth p-channel field effect transistor P5". In the illustrated circuit of FIG. 3, an output resistor Ra is connected to the output of the transconductance amplifier, as already initially mentioned, the output voltage UTA being the voltage drop across this output resistor Ra. For setting the operating point of the transconductance amplifier, a first auxiliary voltage DC is connected to the gate terminal of the fifth p-channel field effect transistor P5" and a second auxiliary voltag DC2 is connected via the gate terminal of the seventh field effect transistor N7". As already initially recited, the gain can be varied proportional to the control current $I_{BIAS}$ in this tranconductance amplifier and, thus, the amplitude at the output of the transconductance amplifier can be controlled.

Figure 4:
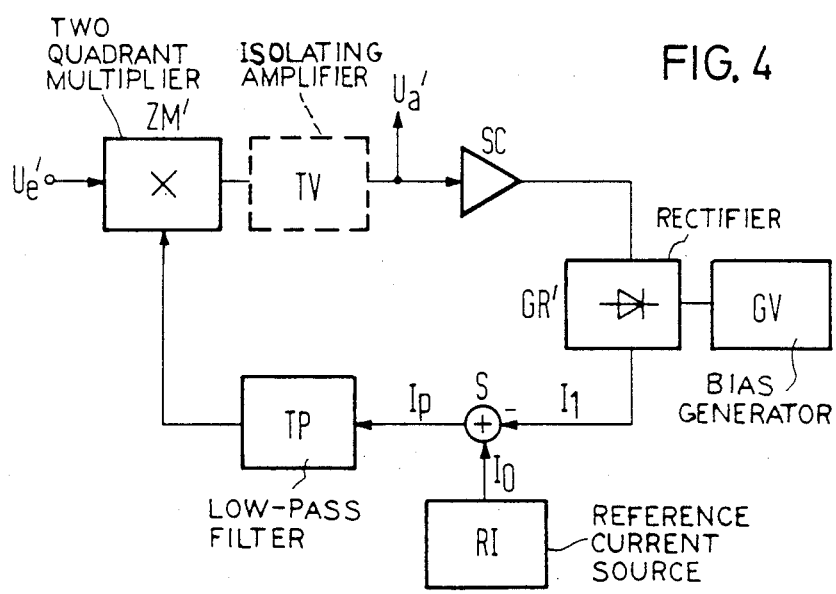
FIG. 4 is a block circuit diagram of the compression amplifier of the present invention having a constant output level for extremely high input levels.
Figure 5:
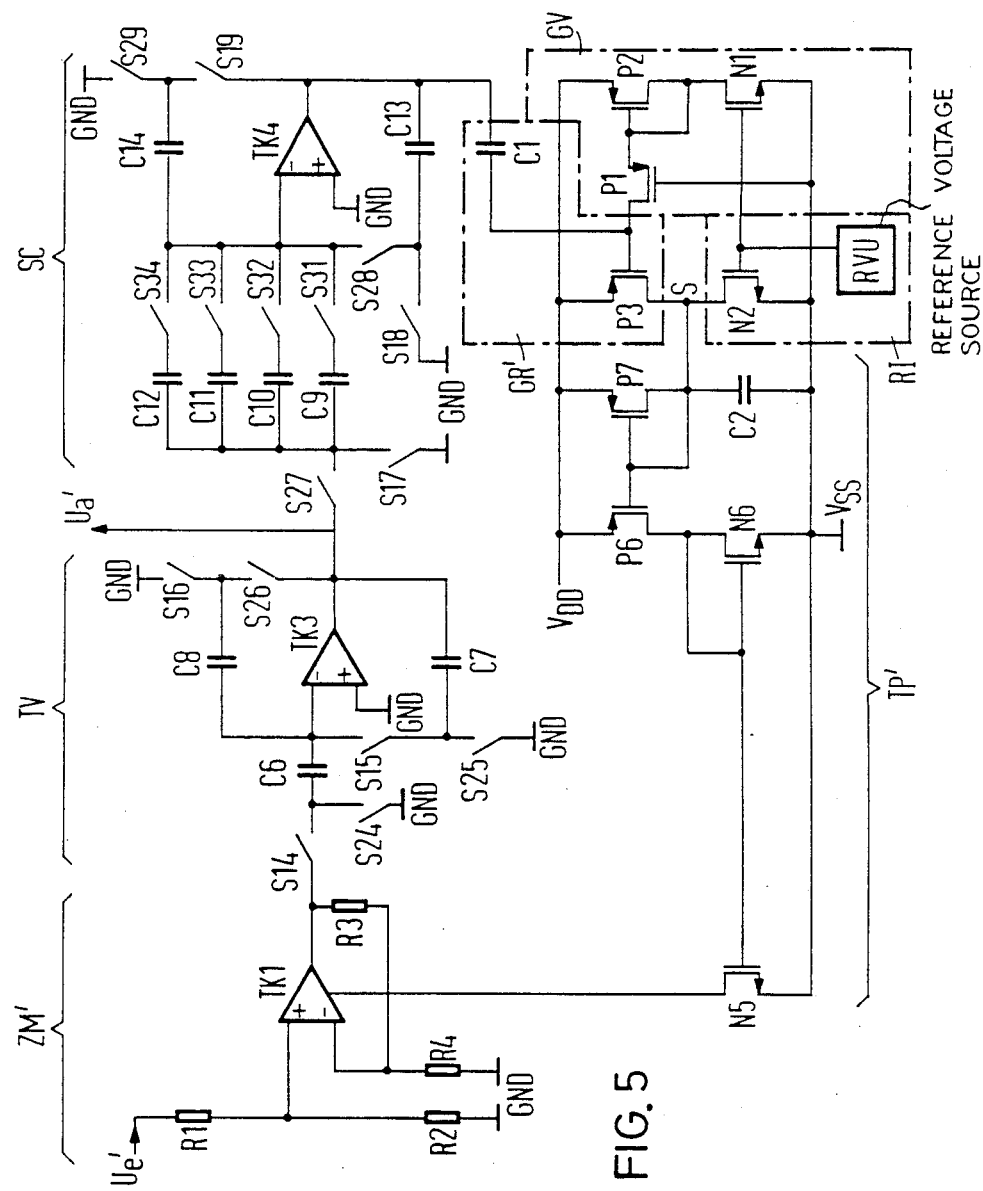
FIG. 5 is a circuit diagram of the compression amplifier of the present invention according to the block circuit diagram of FIG. 4.
Figure 6:
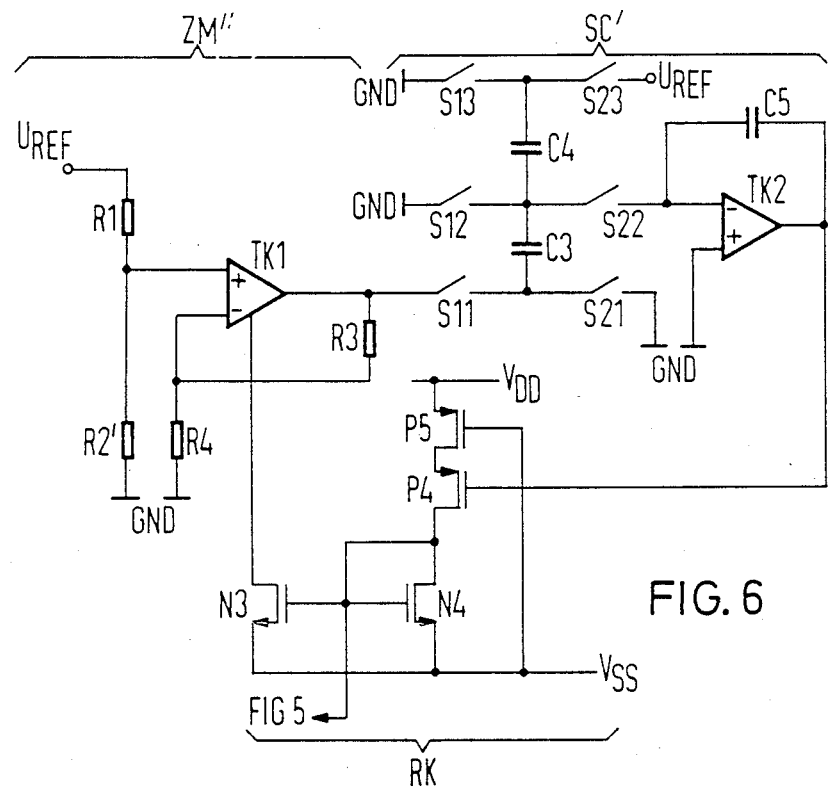
FIG. 6 is a circuit diagram of a reference bias source that is necessary for the operation of the compression amplifier of FIG. 5.

FIG. 4 shows a block circuit diagram of the compression amplifier of the present invention that can be constructed in CMOS technology in its realization according to FIG. 5 and FIG. 6. The output characteristics at the output $U_a'$ of the compression amplifier of the present invention approach a constant output level for high input levels at the input $U_e'$. The compression amplifier of FIG. 4 likewise contains a two quadrant multiplier ZM' whose input also is the input of the compression amplifier $U_e'$. So that the controlled two quadrant multiplier ZM' sees a constant output load, an isolating amplifier TV whose output also is the output $U_a'$ of the compression amplifier follows. In FIG. 4, the isolating amplifier TV is indicated with broken lines since it is not required given a suitable realization of the two quadrant multiplier ZM'. The feedback branch of the compression amplifier of FIG. 4 contains an amplifier having variable gain SC, a rectifier unit GR' having an allocated bias generator GV, as well as a low-pass filter TP' whose output is fedback onto the two quadrant multiplier ZM'. In detail, the output of the isolating amplifier TV or, respectively, the output of the two quadrant multiplier ZM' is connected to the input of the rectifier unit GR' via the amplifier having variable gain SC. In order to achieve the rectifier effect, a threshold voltage is supplied to the rectifier unit GR' via a connected circuit GV for generating a bias voltage. The rectifier unit converts the output voltage amplified by the factor $\alpha$ into a medium current $I_1$ from which the constant current $I_O$ is subtracted at a summation point S. To this end, the output of the rectifier unit GR' that supplies a current signal $-I_1$ and the output of a reference current source RI that generates a constant current $I_O$ are connected to the summation point S. As a result thereof, a control current $I_P$ is calculated at the summation point and is supplied to the low-pass filter TP'. The size of the current $I_O$ is selected such that the gain of the compression amplifier is precisely one for the current $I_1=0$, this corresponding to the condition wherein the compression is shut off. An increase of the output level then generates a higher current $I_1$ and leads to a decrease of the control current IP. As a result thereof, the gain is reduced and the compression begins to a greater degree. In the realization of FIG. 5, the amplifier SC amplifies the fedback signal by the value $\alpha$ and thereby provides a modification of the threshold voltage at which the compression begins. A transconductance amplifier of FIG. 3 can also be utilized for a realization of the two quadrant multiplier ZM' in the block circuit diagram of FIG. 4.

As already recited, the output characteristics of this compression amplifier approach a constant output level for high input levels. As a result the control current $I_P$ decreases to a greater and greater degree, namely, quadratically with the output voltage at the output U3'. A realization on the transistor level for the compression amplifier of the present invention according to FIG. 4 is set forth in FIGS. 5 and 6.

All individual components of the block circuit diagram of the compression amplifier of the present invention are again shown in FIG. 5. In the feedback branch are the amplifier with variable gain SC, the rectifier unit GR' with appertaining circuit GV for generating bias voltage, the reference current source RI as well as the low-pass filter TP'.

In detail, the circuit for generating a bias voltage contains a first n-channel field effect transistor N1 and a first and second p-channel field effect transistor P1, P2. A gate terminal of the first p-channel field effect transistor P1 and a first terminal of the first n-channel field effect transistor N1 are connected in common to a negative bias voltage $V_{ss}$ and a second terminal of the first n-channel field effect transistor N1 and a first terminal of the second n-channel field effect transistor P2 are interconnected in common to a gate terminal of the second p-channel field effect transistor P2 and to a first input of the first p-channel field effect transistor P1. A second terminal of the second p-channel field effect transistor P2 is connected to a positive bias voltage $V_{DD}$ and a second terminal of the first p-channel field effect transistor P1 is connected to the rectifier unit GR'.

The reference current source RI contains a reference bias circuit that is referenced RVU in FIG. 5 and contains a second n-channel field effect transistor N2, whereby the first input of the second n-channel field effect transistor N2 is connected to the negative supply voltage $V_{SS}$ and a second input of the second n-channel field effect transistor N2 that forms the output of the reference current source and supplies the constant current $I_O$ is connected to the summation point S. The gate terminal of the first n-channel field effect transistor N1 and the gate terminal n-channel field effect transistor N2, furthermore, are interconnected with the reference bias circuit RVU whose realization may be derived from FIG. 6.

The rectifier unit GR' belonging to the feedback branch contains a third p-channel field effect transistor P3 and a first capacitance C1, whereby the first capacitance C1 is connected between the output of the amplifier having variable gain SC and the gate terminal of the third p-channel field effect transistor and is also connected to the second terminal of the first p-channel field effect transistor P1 from the circuit for bias generating. Further, a first terminal of the third p-channel field effect transistor T3 is connected to the positive supply voltage $V_{DD}$ and a second terminal of the third p-channel field effect transistor P3 that forms the output of the rectifier unit GR' and supplies the current $-I_1$ is connected to the summation point S. In order to achieve the rectifier effect, the gate terminal of the third p-channel field effect transistor P3 is biased with a threshold voltage. The third p-channel field effect transistor P3 inhibits for positive half-waves that are supplied as input signal via the first capacitor C1. For negative half-waves, the third p-channel field effect transistor P3 acts as current source having a quadratic current characteristic of a MOS transistor.

The low-pass filter TP' via whose input the control current $I_P$ is supplied from the summation point S contains a fifth and sixth n-channel field effect transistor N5, N6, a sixth and seventh p-channel field effect transistor P6, P7 as well as a second capacitor C2. The fifth and sixth n-channel field effect transistor N5, N6 as well as the sixth and seventh p-channel field effect transistor P6, P7 thereby each form a current mirror circuit via which the current $I_P$ is supplied into the differentiating unit of the transconductance amplifier TK1 after a chronological averaging by the second capacitor C2. In detail, a first input of the sixth p-channel field effect transistor P6 and a first input of the seventh p-channel field effect transistor P7 are connected to the positive supply voltage $V_{DD}$ and a first terminal of the fifth n-channel field effect transistor N5 and a first terminal of the sixth n-channel field effect transistor N6 are connected to the negative bias voltage $V_{SS}$. A gate terminal of the fifth n-channel field effect transistor N5, a gate terminal of the sixth n-channel field effect transistor N6, over and above this, are interconnected in common to a second terminal of the sixth p-channel field effect transistor P6 and a second terminal of the sixth n-channel field effect transistor N6. The output of the low-pass filter TP' is formed by a second terminal of the fifth n-channel field effect transistor N5, whereas the second capacitor C2 is connected between the negative supply voltage Vss and a second terminal of the seventh p-channel field effect transistor P7. In addition, the second terminal of the seventh p-channel field effect transistor P7 that forms the input of the low-pass filter TP' is interconnected to the summation point S, to a gate terminal of the sixth and to a gate terminal of the seventh p-channel field effect transistor P6, P7.

Further, the integrated compression amplifier of FIG. 5 has a controlled transconductance amplifier TK1 that represents a critical component part of the two quadrant multiplier ZM'. An input signal at the input $U_e'$ of the two quadrant multiplier ZM' is attenuated via a preceding voltage divider composed of R1 and R2 in order to prevent an overdrive of the first input of the transconductance amplifier TK1. At its output side, the transconductance amplifier TK1 is terminated with a third and fourth resistor R3, R4. The resistors R1 through R4 can be executed as bulk resistors of high-impedance polysilicon or can be executed with similarly doped p-wells; a realization with switched capacitors is thereby likewise possible. The realization of the resistors of high-impedance polysilicon or of lightly doped p-wells, however, has the advantage that additionally introduced clocks do not deteriorate the operation of the transconductance amplifier. In detail, the first and second resistors R1, R2 form the preceding voltage divider that is connected between the input of the two quadrant multiplier ZM' and ground GND. A first input of the first transconductance amplifier TK1 is connected to the voltage divider via a center tap between the first and second resistor R1, R2, whereas the second input thereof is connected to ground GND via a fourth resistor R4. In addition, the second input of the first transconductance amplifier TK1 is connected via the third resistor R3 to the output of the two quadrant multiplier ZM' and to the output of the first transconductance amplifier TK1.

As already initially cited, the two quadrant multiplier ZM' is followed by an isolating amplifier TV in order to decouple the output of the compression amplifier from the two quadrant multiplier ZM'. The isolating amplifier TV is constructed as a "switched capacitor" amplifier and supplies a gain of one. It contains a second transconductance amplifier TK2, as well as switched capacitors, a sixth, seventh and eighth capacitor C6, C7, C8 that are operated via a fourth, fifth, sixth switch of a first type and via a fourth, fifth, sixth switch of a second type. The switches of the first and second type thereby represent transmission gates that are controlled with a two-phase clock. When a switch of the first type is open, this means that a switch of the second type is situated in its closed condition.

In detail, the fourth switch of the first type S14 is connected between the output of the first transconductance amplifier TK1 and a first terminal of the sixth capacitor C6, whereby a fourth switch of the second type S24 is connected between this first terminal and ground GND. The second terminal of the sixth capacitor C6 is thereby connected to a first terminal of the third transconductance amplifier TK3 and is connected to ground GND via series circuit formed by the fifth switch of the first type S15 and of the fifth switch of the second type S25. In this series circuit, the fifth switch of the second type S25 has one side connected to ground GND.

The output of the third transconductance amplifier TK3 that forms an output of the isolating amplifier TV and via which the output signal can be taken at the output Ua' of the compression amplifier is fedback via the seventh capacitor C7 onto a center terminal between the fifth switch of the first type S15 and the fifth switch of the second type S25. A sixth switch of the first type S16 and a sixth switch of the second type S26 that likewise form a series circuit are connected between ground GND and the output of the third transconductance amplifier TK3, whereby the sixth switch of the first type S16 has one side connected to ground GND. Further, a first terminal of the eighth capacitor C8 is connected to a center tap between the sixth switch of the first type S16 and the sixth switch of the second type S26 and the second terminal of the eighth capacitor C8 is connected to the first input of the third transconductance amplifier TK3. Finally, the second terminal of the third transconductance amplifier TK3 is also connected to ground GND.

As already recited, the amplifier having variable gain SC that is constructed as a "switched capacitor" amplifier and that contains a fourth transconductance amplifier TK4 is situated in the feedback branch. Also, provide are connectible capacitors, a ninth, tenth, eleventh and twelfth capacitor C9, C10, C11 and C12, an integrator capacitor C14 as well as further switches of a first, second and third type. The ratio of input capacitance to integrator capacitance and, thus, the gain can be varied with the assistance of the switches of the third type. The range of amplification thereby extends from $$0 < \alpha > Cmax/C14 \text{ with}$$
$$Cmax = C9 + C10 + C11 + C12$$

This enables a variation of the threshold voltage beginning with which the compression starts. Via the first capacitor C1, the AGC input signal is coupled onto the gate terminal of the third p-channel field effect transistor P3 of the rectifier unit GR' The existing capacitors in the amplifier having variable gain SC are also again executed as switched capacitors, whereas the switches of the third type can be realized as simple on-off switches.

In detail, a parallel capacitor network and a seventh switch of the second type S27 are arranged between the first input of the fourth transconductance amplifier TK4 and the input of the amplifier having variable gain SC, whereby the center tap between the parallel capacitor network and the seventh switch of the second type S27 is connected to ground GND via a seventh switch of the first type S17. The parallel capacitor network of FIG. 5 contains four series circuits, whereby each series circuit is composed of a capacitor and of a switch of the third type. The ninth capacitor C9 is thereby connected in series with the first switch of the third type S31, the tenth capacitor C10 is connected in series with the second switch of the third type S32, the eleventh capacitor C11 is connected in series with the third switch of the third type S33 and, finally, the twelfth capacitor C12 is connected in series with the fourth switch of the third type S34. All four series circuits are respectively connected in parallel at their two terminals and form the parallel capacitor network which is arranged between the first input of the fourth transconductance amplifier TK4 and the seventh switch of the second type S27. The output of the fourth transconductance amplifier TK4 that simultaneously forms the output of the amplifier having variable gain is connected both to the parallel capacitor network as well as to the first input of the fourth transconductance amplifier TK4, being connected thereto via a series circuit composed of a thirteenth capacitor C13 and of an eighth switch of the second type S28. Further, the center tap between this eighth switch of the second type S28 and the thirteenth capacitor C13 is connected to ground GND via an eight switch of the first type S18. In addition, the output of the fourth transconductance amplifier TK4 is fedback onto the first input of the fourth transconductance amplifier T4 via a ninth switch of the first type S19 in series with the fourteenth capacitor C14 and the center tap between the ninth switch of the first type S19 and the fourteenth capacitor C14 is connected to ground GND via the ninth switch of the second type S29. Finally, the second input of the fourth transconductance amplifier TK4 is likewise connected to ground GND.

FIG. 6 shows the realization of the reference bias circuit that, according to FIG. 5, forms the reference current source RI in common with the second n-channel field effect transistor N2. The reference bias circuit is constructed fundamentally similar to the compression amplifier circuit of FIG. 5 and contains a further two quadrant multiplier having a preceding voltage divider ZM" and contains an amplifier with switched capacitors SC' in the feedback branch and also contains a following feedback network RK. The same transconductance amplifier TK1 as in the compression amplifier is utilized in the two quadrant multiplier ZM" in the reference bias circuit. A reference voltage $U_{Ref}$ that can also be identical to the positive supply voltage $V_{DD}$ ends at the preceding voltage divider. Independently of the absolute value of all employed resistors, the feedback current at the output of the feedback branch should be as high as the output current of the reference current source, so that the gain becomes 1. In contrast to the preceding voltage divider of the two quadrant multiplier ZM' in FIG. 5, the attenuation of the reference bias circuit is higher by a factor of two so that an output voltage of one-half the voltage reference $U_{REF/2}$ is to be anticipated at the output of the further two quadrant multiplier ZM". To this end, the value of resistance of R2' is selected half as large as that of R2 in FIG. 5. The output voltage of the further two quadrant multiplier ZM" is again compared to the reference voltage $U_{REF}$. This occurs in the differentiating input of the amplifier having switched capacitors SC' that is constructed as a "switched capacitor" integrator. From the capacitor C4, the charge $C_0$ multiplied by $U_{REF}$ proceeds onto the integrator input in the case of the closed switch S23, whereas the capacitor C3 that is designed twice as large as the capacitor C4 connects the charge $-2C_0$ multiplied by the output voltage of the further two quadrant multiplier ZM" onto the integrator input. When the output voltage of the two quadrant multiplier ZM" is greater than half the reference voltage $U_{REF}$, then the voltage at the integrator output rises. As a result thereof, however, the current through the p-channel field effect transistor P4 in the feedback network RK is reduced. When, however, the output voltage of the further two quadrant multiplier ZM" is lower than the reference voltage $U_{REF/2}$, then the relationships are reversed and the current rises. This current is supplied to the first transconductance amplifier TK1 as a control current via a current mirror circuit formed by the third and fourth n-channel field effect transistor N3, N4 in the feedback network RK. When the control current decreases, then the gain is also diminished. An equilibrium at which the output voltage of the two quadrant multiplier is half of the reference voltage $U_{REF/2}$ will therefor be established as a consequence of the feedback. The voltage at the output of the reference bias circuit is then such that the gain of the compression amplifier is precisely one when the compression is shut off. This can be assumed since the compression amplifier and the reference bias circuit are situated on the same chip and, thus, the scatter of the resistance coatings and transistor constants is slight.

In detail, the interconnection of the reference bias circuit is as follows. The feedback network contains a third and fourth n-channel field effect transistor N3, N4 and a fourth and fifth p-channel field effect transistor P4, P5, whereby a first terminal of the third n-channel field effect transistor N3, a first terminal of the fourth n-channel field effect transistor N4 and a gate terminal of the fifth pchannel field effect transistor P5 are connected to a negative supply voltage $V_{SS}$ and a first terminal of the fifth p-channel field effect transistor is connected to the positive supply voltage $V_{DD}$. A second terminal of the fifth p-channel field effect transistor P5 is connected to a first terminal of the fourth p-channel field effect transistor P4 and a second terminal of the fourth p-channel field effect transistor P4, a second terminal and a gate terminal of the fourth n-channel field effect transistor N4 are connected to the gate terminal of the third n-channel field effect transistor N3 and in common form the output of the reference bias circuit. This output is connected to the gate terminals of the first and second n-channel field effect transistor N1, N2 in the compression amplifier of FIG. 5. As already recited, the two n-channel field effect transistors N3 and N4 thereby form a current mirror circuit, whereby the second input of the third n-channel field effect transistor N3 forms the output of the feedback network RK and is fedback onto the control input of the first transconductance amplifier TK1. The gate terminal of the fourth p-channel field effect transistor P4 is connected to the output of the amplifier having switched capacitors SC' and represents the input of the feedback network RK.

The further two quadrant multiplier ZM" is constructed similar to the two quadrant multiplier ZM of the compression amplifier of FIG. 5. It contains the same transconductance amplifier TK1 as the two quadrant multiplier ZM1 of FIG. 5 and contains a preceding voltage divider. In contrast to FIG. 5, the second resistor R2' is thereby selected half as high in terms of its value of resistance as the value of resistance of the second resistor R2 in the preceding voltage divider of the compression amplifier. A reference voltage $U_{REF}$ that, as already recited, can be identical to the supply voltage $V_{DD}$ is applied to the input of the preceding voltage divider. As the result of these measures and as a result of the feedback circuit composed of the amplifier having switched capacitors SC' and the feedback network RK, an output voltage of half the reference voltage $U_{REF}/2$ is to be anticipated. In terms of its remaining connection, the further two quadrant multiplier ZM" corresponds to the connection of the two quadrant multiplier ZM' of the compression amplifier. Identical reference characters to those in FIG. 5 are therefor also employed in FIG. 6.

According to FIG. 6, the output of the further two quadrant multiplier ZM" is connected to the amplifier having switched capacitors SC'. It contains a third, fourth and fifth capacitor C3, C4 and C5, a first, second and third sWitch of the first type S11, S12, S13 and a first, second and third switch of the second type S21, S22 and S23. The first switch of the first type S11 is connected to the first switch of the second type S21 serially between the output of the further two quadrant multiplier ZM" and ground GND, whereby the first switch of the second type S21 has one side connected to ground GND. The second switch of the first type S12 is serially connected with the second switch of the second type S22 between ground GND and the first input of the second transconductance amplifier TK2, whereby the second switch of the first type S12 thereby has one side connected to ground GND. The third switch of the first type S13 and the third switch of the second type S23 are connected serially between ground GND and the reference voltage $U_{REF}$, whereby the ground GND is connected to the third switch of the first type S13. The third capacitor C3 that is to be designed twice as large in size as the fourth capacitor C4 is connected, first, to a center tap between the first switch of the first type S11 and the first switch of the second type S21 and, second, to the center tap between the second switch of the first type S12 and the second switch of the second type S22, whereas the fourth capacitor C4 is connected, first, to a center tap between the third switch of the first type S13 and the third switch of the second type S23 and, second, to a center tap between the second switch of the first type S12 and the second switch of the second type S22. The output of the second transconductance amplifier TK2 that also is the output of the amplifier having switch capacitors SC' is fedback via a fifth capacitor C5 onto the first input of the second transconductance amplifier TK2 and the second input of the second transconductance amplifier is likewise connected to ground GND. Switches of the first and second type can again be realized as transmission gates.

For high input levels, the output characteristics of the compression amplifier of FIG. 4 approach a constant output level. In order to achieve output characteristics of the compression amplifier wherein the increase in the gain is greater than zero even after the threshold voltage is reached, the control current (it is proportional to the gain in the transconductance amplifier) should decrease to a less pronounced degree (hyperbolically) with increasing amplitude as expressed in the equation for the gain factor.

$$V_u(U_e) = (U_e/U_{eth}) - (1 - K_v)$$

This curve of the output characteristic can be approached in that the power characteristic of the control transistor in the feedback branch is traversed in a reverse direction. The operating point for this control transistor is selected such that the maximum control current $I_P = I_O$ flows, this supplying the gain 1. The constant current $I_O$ is thereby taken from a reference voltage source whose output is connected onto a p-channel field effect transistor.

Figure 7:
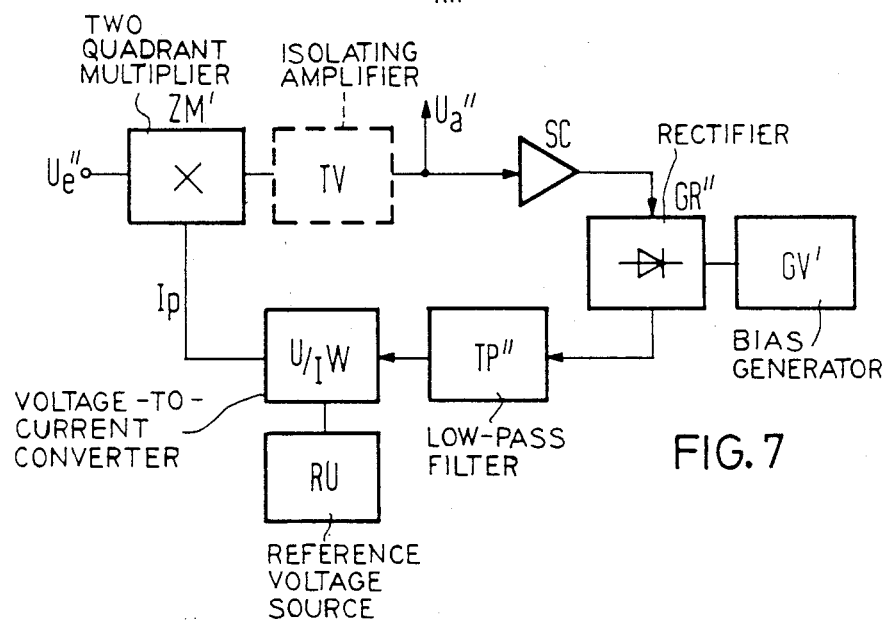
FIG. 7 is a block circuit diagram of a compression amplifier of the present invention whose output level rises less with increasing input level after a threshold voltage is transgressed.

For this purpose, FIG. 7 shows a compression amplifier of the present invention that can be realized in CMOS technology and that has a modified feedback circuit. The compression amplifier of FIG. 7 likewise contains a two quadrant multiplier ZM', an isolating amplifier TV that is to be potentially added, and, in the feedback branch, an amplifier having variable gain SC, a rectifier unit GR" with a connected circuit for generating bias voltage GV', a low-pass filter TP", and a voltage-to-current converter U/IW whose output is fedback onto the two quadrant multiplier ZM'. Further, a reference voltage source RU is connected to the voltage-to-current converter U/IW. As in the block circuit diagram of FIG. 4, the two quadrant multiplier ZM' is likewise connected between the input and output Ue", $U_a$" of the compression amplifier, whereas the amplifier having variable gain SC is connected between the rectifier unit GR" and the output of the compression amplifier $U_a$". Finally, the output of the rectifier unit GR" is connected to the input of the voltage-to-current converter U/IW via the low-pass filter TP". It may be seem from FIG. 8 and FIG. 9, that individual components such as the two quadrant multiplier ZM', the isolating amplifier TV and the amplifier having variable gain SC for the realization of this compression amplifier can be constructed in exactly the same fashion as the corresponding components in the compression amplifier of FIG. 4.

Figure 8:
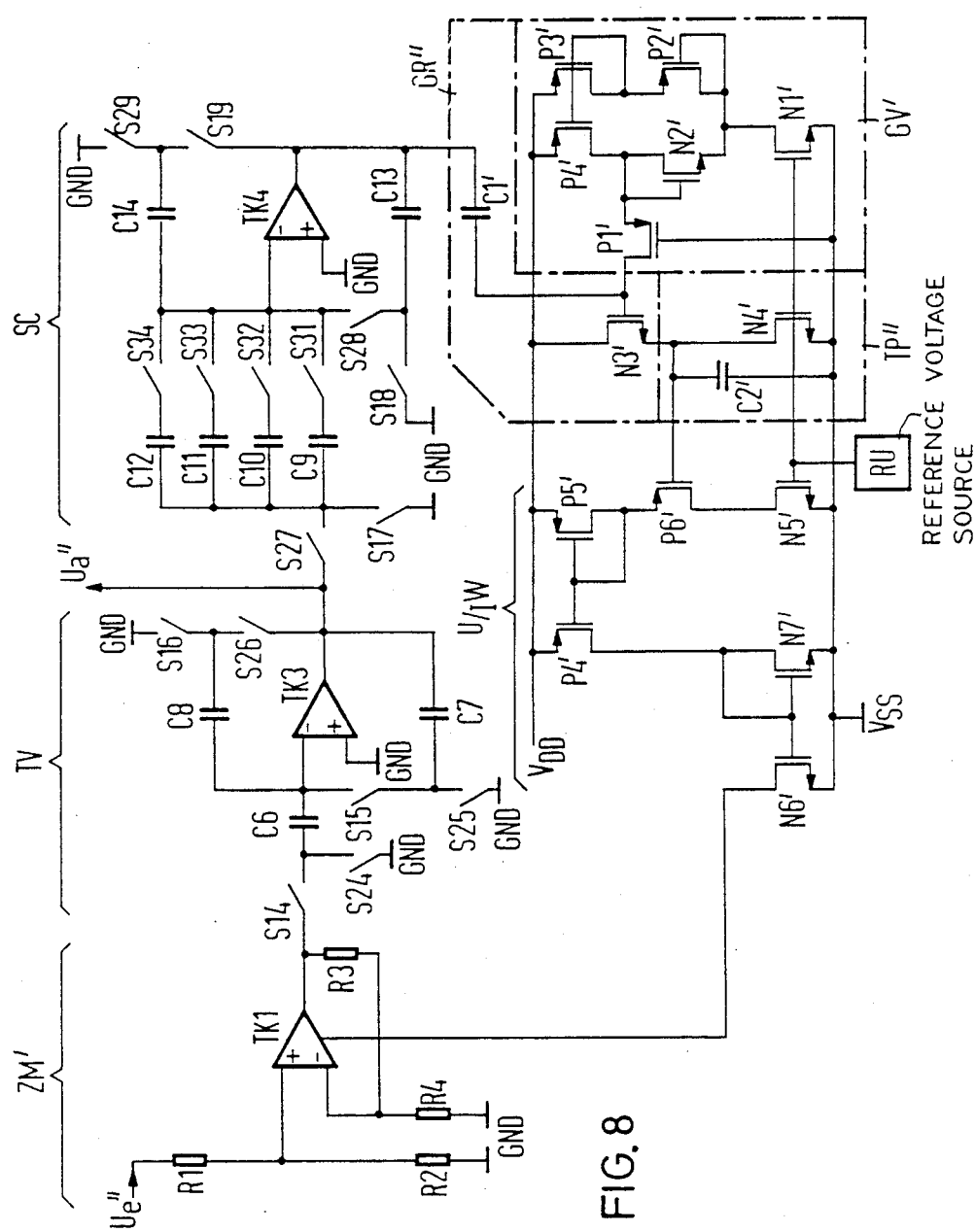
FIG. 8 is a circuit diagram of the compression amplifier according to the block circuit diagram of FIG. 7.

The realization on the transistor circuit in FIG. 8 shows the two quadrant multiplier ZM' with connected isolating amplifier TV as well as the modified feedback circuit. The amplified output signal of the amplifier with variable gain SC is capacitively coupled in onto the gate terminal of the third n-channel field effect transistor N3' via a first capacitor C1'. Together with this capacitor, the third n-channel field effect transistor N3' forms a peak value rectifier and the rectifier unit GR". For controlling the cascade transistor (formed by the sixth p-channel field effect transistor P6'), the rectified signal is applied to the gate terminal thereof. Via two connected current mirror circuits each formed by the two field effect transistors P4', P5' as well as N6', N7', the cascade transistor P6' converts the rectified signal into the control current $I_P$. Due to the constant voltage, at the output of the reference voltage source RU that is applied to the gate terminal of the fifth n-channel field effect transistor N5', a current $I_O$ is impressed. The power characteristic is utilized in reverse direction for the cascade transistor P6' that can also be referred to as control transistor. i.e., for gate voltages below $V_{DD}-2T_P$ ($V_{TP}$=threshold voltage of the p-channel field effect transistor), the current through the control transistor rises quadratically to a maximum value of $I_O$. The operating point of the cascade or control transistor P6' is then placed such that the maximum current $I_O$ can flow. When an alternating signal is rectified via the third n-channel field effect transistor N3', the voltage at the gate terminal of the cascade or, respectively, control transistor P6' rises. The control current $I_P$ as well as the gain are thereby reduced. When the cascade or the control transistor P6' and the fifth p-channel field effect transistor P5' are identically constructed, they both require the same gate-source voltage for the current $I_O$. Since the currents are very low, it can also be said that the gate voltage should lie below the positive supply voltage $V_{DD}$ by two threshold voltages. The operating point of the cascade or control transistor P6', however, must be set via that of the third n-channel field effect transistor N3' (rectifier transistor). The gate voltage at the third n-channel field effect transistor N3' must thereby lie higher than that of the cascade or control transistor P6' by one threshold voltage. A circuit for generating bias voltage GV' that shall be set forth in greater detail below is utilized for generating this voltage.

The circuit for generating bias voltage GV' contains a first, second, third and fourth p-channel field effect transistor P1', P2', P3' and P4' as well as a first and second n-channel field effect transistor N1', N2'. A gate terminal of the first p-channel field effect transistor P1' and a first terminal of the first n-channel field effect transistor N1' are connected in common to a negative supply voltage $V_{SS}$, whereas a first terminal of the first p-channel field effect transistor P1' and a first terminal of the second n-channel field effect transistor N2' are connected in common to a gate terminal of the second n-channel field effect transistor N2'. The second terminal of the second n-channel field effect transistor N2' and the second terminal of the first n-channel field effect transistor N1' are connected in common onto the first input of the second p-channel field effect transistor P2' and the gate terminal of the second p-channel field effect transistor P2'. Further, a second terminal of the second p-channel field effect transistor P2' is connected to the first input of the third p-channel field effect transistor P3' and to the gate terminal of the third and fourth p-channel field effect transistor P3', P4', and a first terminal of the second n-channel field effect transistor N2' is connected to the first terminal of the fourth p-channel field effect transistor P4'. A second terminal of the third p-channel field effect transistor P3' and a second terminal of the fourth p-channel field effect transistor P4' are connected in common onto the positive supply voltage $V_{DD}$, and a second terminal of the first p-channel field effect transistor P1' is connected to the rectifier unit GR' via the gate terminal of the third n-channel field effect transistor N3'. The second and third p-channel field effect transistor P2' and P3' are thereby connected as diodes, so that their gate-source voltage is identical to that with the control or cascade transistor P6' and the fifth n-channel field effect transistor N5'. Due to the current mirror circuit formed by the third and fourth p-channel field effect transistor P3' and P4', the same current as flows through the current branch of the second and third p-channel field effect transistor P2' and P3' will also flow in the current branch between the fourth p-channel field effect transistor P4' and the second n-channel field effect transistor N2'. A voltage, $V_{DD}-2V_{TP}$ ($V_{TP}$=threshold voltage of the p-channel field effect transistor), is then established at the summation point between the second n-channel field effect transistor N2' and the second p-channel field effect transistor P2'. The second n-channel field effect transistor N2' also operates as a diode and generates a gate-source voltage of $V_{TN}$, whereby $V_{TN}$ describes the threshold voltage of an n-channel field effect transistor. A voltage of $U_{GN2'}=V_{DD}-2V_{TP}+V_{TN}$ is then established at the gate terminal of the second n-channel field effect transistor N2'. This sought bias voltage is then forwarded to the gate terminal of the third n-channel field effect transistor N3' via the first pchannel field effect transistor P1' acting as a resistor. When the current densities in the circuit for generating bias voltage are increased for setting the operating point in comparison to the current branch formed of the field effect transistors N5', P6' and P5', then an operating point at which it is assured that the cascade or control transistor P6' reliably allows the current $I_O$ to pass through is obtained.

As already recited, the rectifier unit GR" contains a third n-channel field effect transistor N3' and a first capacitor C1', whereby the first capacitor C1' is connected between the output of the amplifier having variable gain SC and the gate terminal of the third n-channel field effect transistor N3' and the second terminal of the first p-channel field effect transistor P1' from the circuit for generating bias voltage GV'. A first terminal of the third n-channel field effect transistor N3' is connected to the positive supply voltage $V_{DD}$ and a second terminal of the third n-channel field effect transistor N3' is connected to the low-pass filter TP".

The low-pass filter TP" contains a second capacitor C2' and a fourth n-channel field effect transistor N4', whereby the first terminal of the second capacitor C2' and a first terminal of the fourth n-channel field effect transistor N4' are connected in common to the output of the rectifier unit, in this case, the second terminal of the third n-channel field effect transistor N3'. The second terminal of the second capacitor N2' and the second terminal of the fourth n-channel field effect transistor N4' are connected in common to the negative supply voltage $V_{SS}$ and the first terminal of the second capacitor C2' and the first terminal of the first n-channel field effect transistor N4' in common form the output of the low-pass filter TP".

The voltage-to-current converter U/IW connected at the output of the low-pass filter TP″ contains a fourth, fifth and sixth n-channel field effect transistor N5″, N6′, N7′ and a fourth, fifth and sixth p-channel field effect transistor P4′, P5′ and P6′. The two p-channel field effect transistors P4, and P5′ form a first current mirror circuit and the two n-channel field effect transistor N6′ and N7′ form the second current mirror circuit. In detail, the first terminal of the fifth n-channel field effect transistor N5′ and the first terminal of the sixth n-channel field effect transistor N6′ as well as the first terminal of the seventh n-channel field effect transistor N7′ are connected in common to the negative supply voltage $V_{SS}$ and a first terminal of the fourth p-channel field effect transistor P4′ and a first terminal of the fifth p-channel field effect transistor P5′ are connected to the positive supply voltage $V_{DD}$. The gate terminal of the sixth n-channel field effect transistor N6′ and the gate terminal of the seventh n-channel field effect transistor N7′ are connected in common to the second terminal of the seventh n-channel field effect transistor N7′ and the second terminal of the fourth p-channel field effect transistor P4′, and a gate terminal of the fourth p-channel field effect transistor P4′ and a gate terminal of the fifth p-channel field effect transistor P5′ are connected in common to a second input of the fifth p-channel field effect transistor P5′ and to the first input of the sixth p-channel field effect transistor P6′ that is also referred to as control or, respectively, cascade transistor. Further, a second terminal of the sixth p-channel field effect transistor P6′ is connected to the second terminal of the fifth n-channel field effect transistor N5′ and a gate terminal of the sixth p-channel field effect transistor P6′ is to be connected to the output of the low-pass filter. The second terminal of the sixth n-channel field effect transistor N6′ forms the output of the voltage-to-current converter and is fed back onto the two quadrant multiplier ZM′.

The structure of the remaining components such as the two quadrant multiplier ZM′, the isolating amplifier TV and the amplifier having variable gain SC can be constructed by the corresponding components according to the particulars of the circuit in FIG. 5. The same reference characters of the corresponding components of FIG. 5 are therefor used in the realization of the individual components of FIG. 6.

Figure 9:
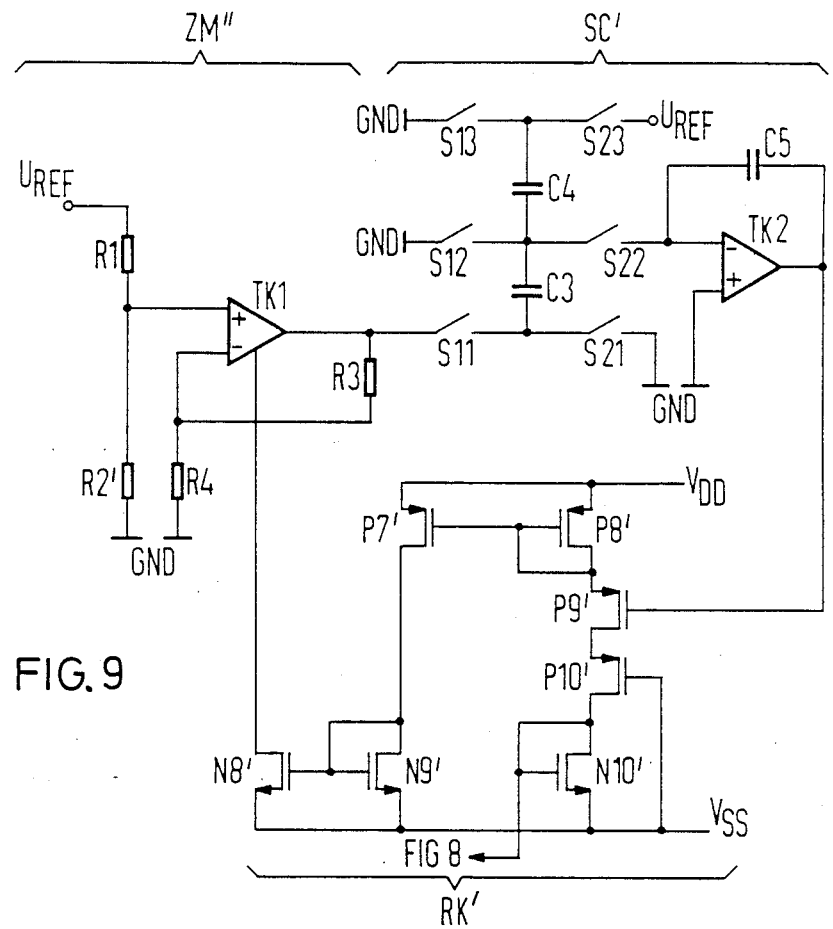
FIG. 9 is a circuit diagram of a reference voltage source for operating the compression amplifier of the present invention according to FIG. 8.
Figure 10:
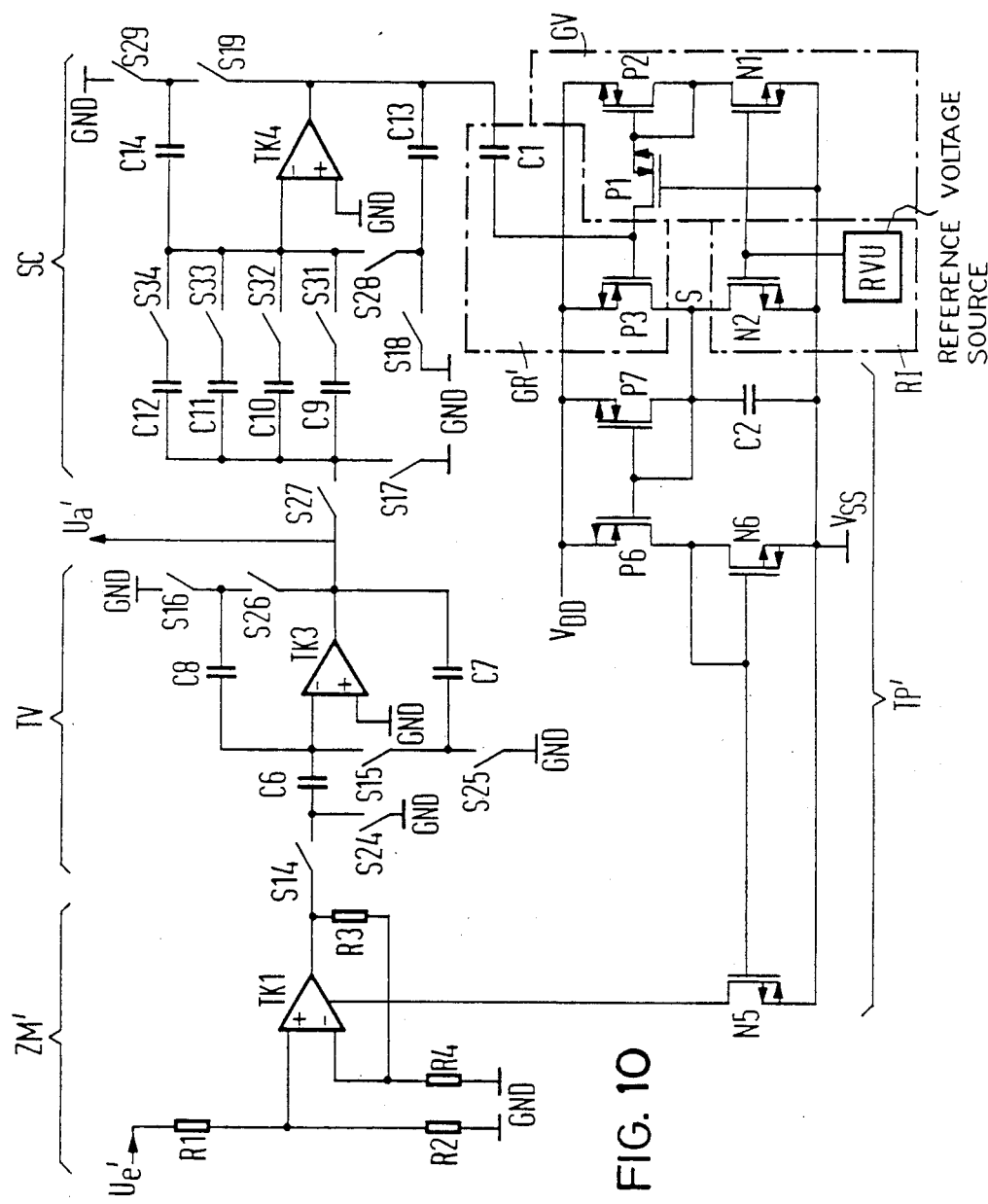
FIG. 10 is a circuit diagram corresponding to the FIG. 5 circuit diagram which utilizes P-channel field effect transistors.
Figure 11:
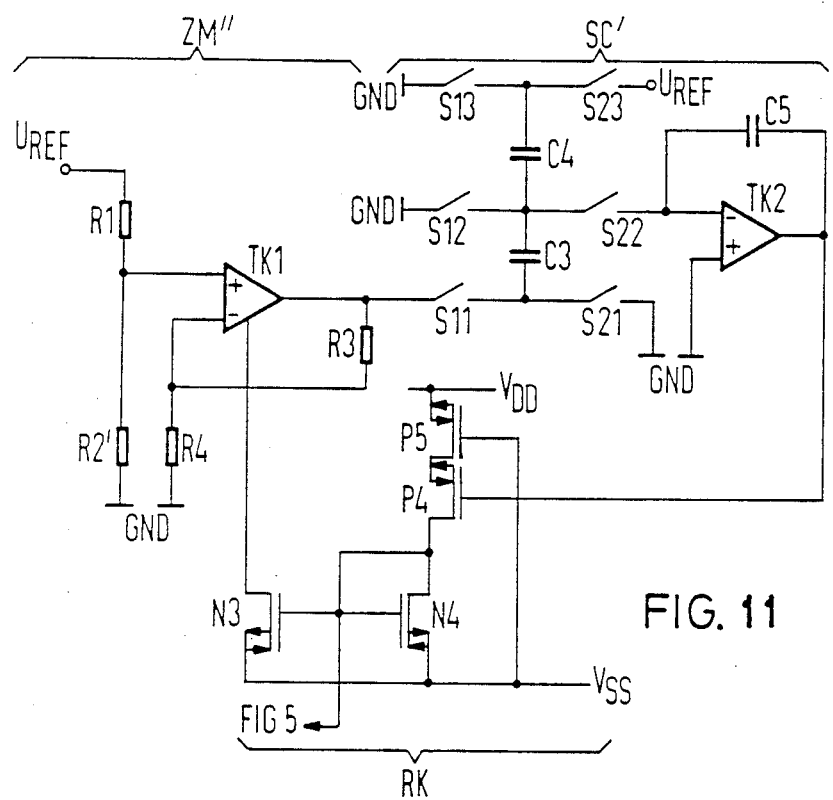
FIG. 11 is a circuit diagram corresponding to the FIG. 6 circuit diagram which utilizes P-channel field effect transistors.
Figure 12:
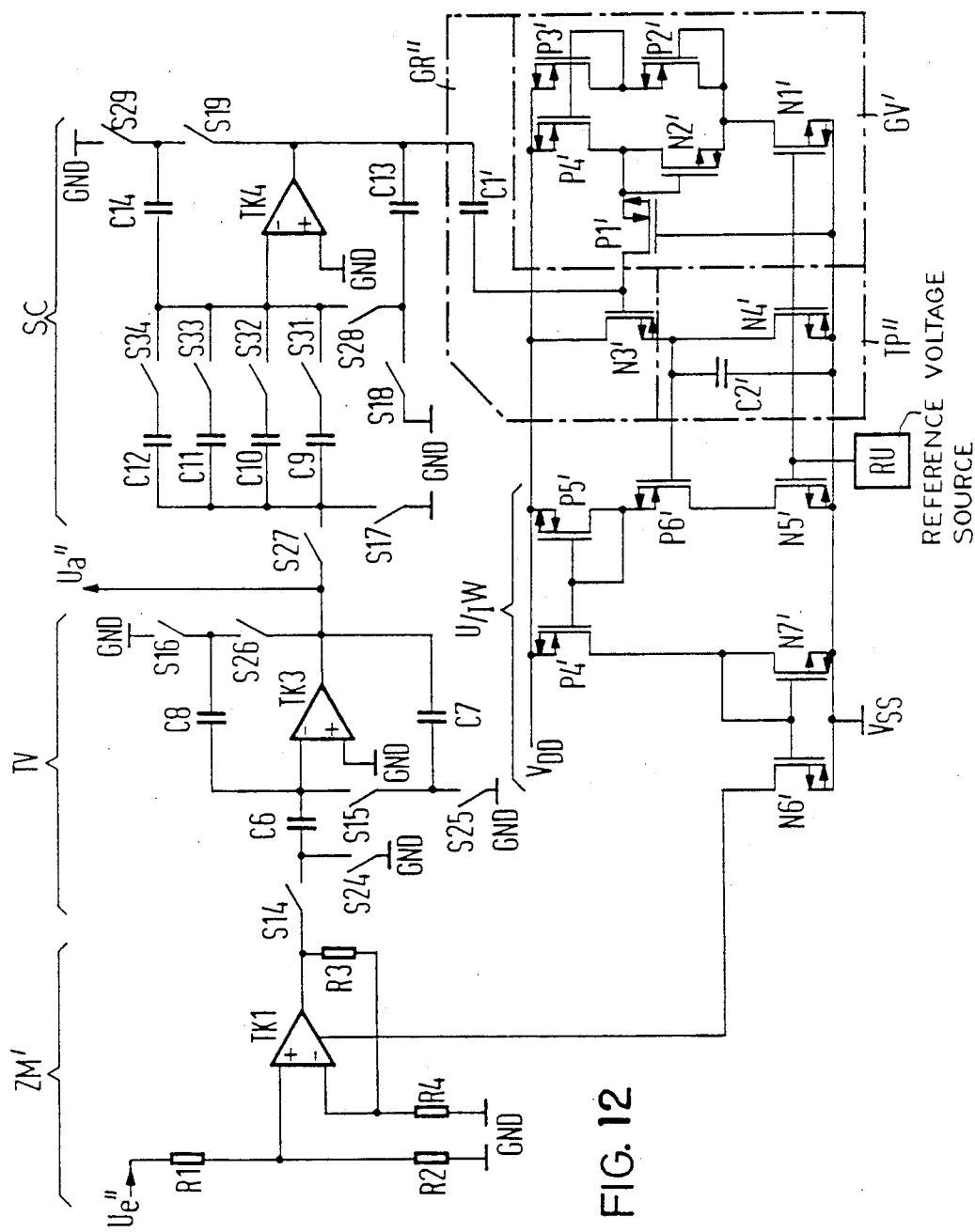
FIG. 12 is a circuit diagram corresponding to the FIG. 8 circuit diagram which utilizes P-channel field effect transistors.
Figure 13:
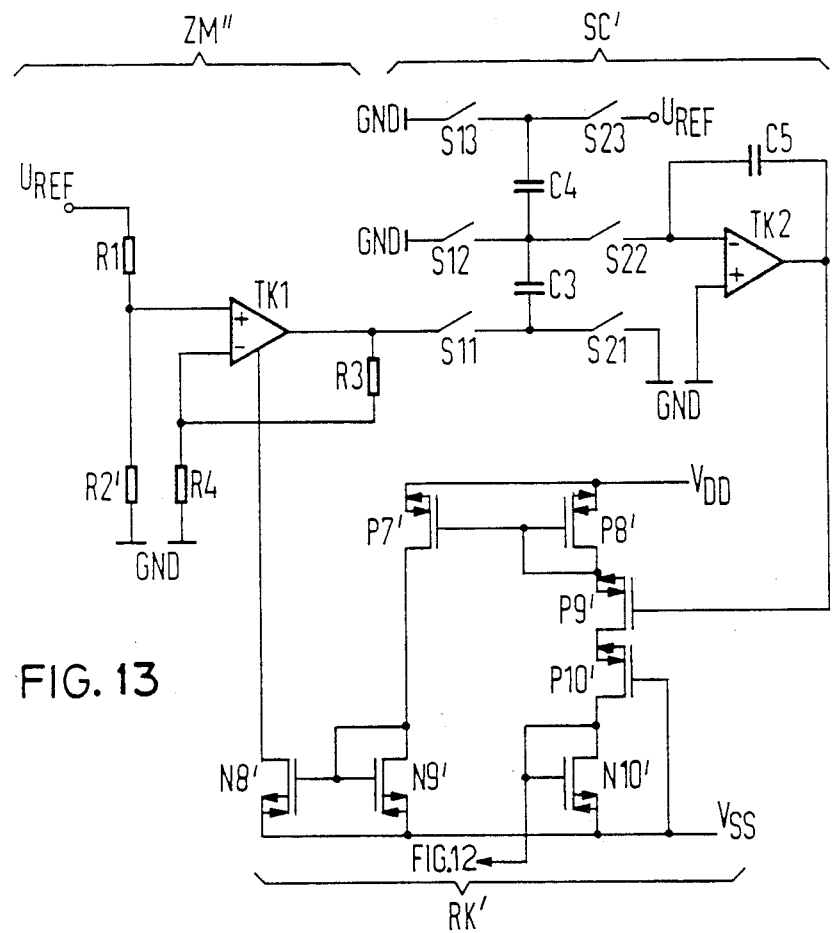
FIG. 13 is a circuit diagram corresponding to the FIG. 9 circuit diagram which utilizes P-channel field effect transistors.

FIG. 9, finally, shows the realization of the reference voltage source RVU at the transistor level. Large parts of this circuit are constructed like the reference bias circuit of FIG. 6 and it contains a two quadrant multiplier ZM″ and, in the feedback branch, an amplifier having switched capacitors SC′ as well as a feedback network RK′. The realization of the two quadrant multiplier ZM″ as well as of the amplifier SC′ realized as an "switched capacitor" amplifier is formed with components corresponding to the corresponding components of FIG. 6, so that the same reference characters apply. The feedback network RK′ is also fed back onto a control input of the two quadrant multiplier ZM″. Differing from the circuit of FIG. 6, the reference voltage source in FIG. 9 contains a modified feedback network. It contains an eighth, ninth and tenth n-channel field effect transistor N8′, N9′ and N10′ as well as a seventh, eighth, ninth and tenth p-channel field effect transistor P7′, P8′, P9′ and P10′, whereby the two p-channel field effect transistor P7′, P8′ as well as the two n-channel field effect transistors N8′ and N9′ each form a current mirror circuit. The first terminal of the eighth n-channel field effect transistor N8′, the first terminal of the ninth n-channel field effect transistor N9′, a first terminal of the tenth n-channel field effect transistor N10′ and a gate of the tenth p-channel field effect transistor T10′ are connected in common to a negative supply voltage $V_{SS}$ and a gate terminal of the eighth n-channel field effect transistor N8′ and a gate terminal of the ninth n-channel field effect transistor N9′ are connected in common to a second terminal of the ninth n-channel field effect transistor N9′ and to a first terminal of the seventh p-channel field effect transistor P7′. The second terminal of the seventh n-channel field effect transistor P7′ is connected the positive supply voltage $V_{DD}$ together with a first terminal of the eighth p-channel field effect transistor T8′. The gate terminal of the seventh pchannel field effect transistor P7′ and a gate terminal of the eighth p-channel field effect transistor P8′ are connected in common to the second terminal of the eighth p-channel field effect transistor P8′ and to a first terminal of the ninth p-channel field effect transistor P9′. Further, the second terminal of the ninth p-channel field effect transistor P9′ is connected to a first terminal of the tenth p-channel field effect transistor P10′ and a second terminal of the tenth p-channel field effect transistor P10′ and a second terminal of the tenth n-channel field effect transistor N10′ are connected in common to a gate terminal of the tenth n-channel field effect transistor N10′. The second terminal of the eighth n-channel field effect transistor N8′ forms the output of the feedback network RK′ and the gate terminal of the ninth p-channel field effect transistor P9′ is connected to the output of the amplifier having switched capacitors SC′. The gate terminal and the second terminal of the tenth n-channel field effect transistor N1O′ form the output of the reference voltage source RVU and is connected to the gate terminal of the first, fourth and fifth n-channel field effect transistor N1′, N4′ and N5′.

As depicted in FIGS. 10, 11, 12 and 13, which correspond to FIGS. 5, 6, 8 and 9, respectively, p-channel field effect transistors can be used for the field effect transistors of the first type (N1 through N6 and N1′ through N10′) and n-channel field effect transistors can be used for the field effect transistors of the second type (P1 through P7, P1′ through P10′). For this embodiment the first reference point $V_{SS}$ is connected to a positive supply voltage and the second reference point $V_{DD}$ is connected to a negative supply voltage.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A compression amplifier having a two quadrant multiplier (ZM′) and a feedback branch that contains a rectifier unit (GR′) and a following low-pass filter (TP′), whereby one output of the low-pass filter (TP′) is fed back onto the two quadrant multiplier (ZM′) and the two quadrant multiplier (ZM′) with a preceding voltage divider is connected between an input and an output ($U_{e'}$, $U_{a'}$) of the compression amplifier, comprising an amplifier having variable gain (SC) connected in the feedback branch between the rectifier unit (GR′) and the output ($U_{a'}$) of the compression amplifier; the rectifier unit (GR′) having a circuit for generating a bias voltage (GV) allocated to it; and a reference current source (RI) connected to a summation point (S) between the low-pass filter (TP') and the rectifier unit (GR').

2. The compression amplifier according to claim 1, wherein the circuit for generating a bias voltage (GV) contains a first field effect transistor of a first type (N1) and first and second field effect transistors of a second type (PI, P2) and a gate terminal of the first field effect transistor of the second type (P1) and a first terminal of the first field effect transistor (N1) of the first type are connected in common to a first reference point ($V_{SS}$), a second terminal of the first field effect transistor (N1) of the first type and a first terminal of the second field effect transistor of the second type (P2) being connected in common to a gate terminal of the second field effect transistor of the second type (P2) and to a first input of the first field effect transistor of the second type (P1); wherein a second terminal of the second field effect transistor of the second type (P2) is connected to a second reference point ($V_{DD}$) and a second terminal of the first field effect transistor of the second type (P1) is connected to the rectifier unit (GR'); wherein the reference current source (RI) contains a second field effect transistor of the first type (N2) and a reference bias circuit (RVU); wherein a first input of the second field effect transistor of the first type (N2) is connected to the first reference point ($V_{SS}$) and a second input of the second field effect transistor of the first type (N2) is connected to the summation point (S); and wherein a gate terminal of the first field effect transistor of the first type (N1) and a gate terminal of the second field effect transistor of the first type (N2) are connected to the reference bias circuit (RVU).

3. The compression amplifier according to claim 2, wherein the rectifier unit (GR') contains a third field effect transistor of the second type (P3) and a first capacitor (C1); wherein the first capacitor (C1) is connected between an output of the amplifier having variable gain (SC) and a gate terminal of the third field effect transistor of the second type (P3) in common with the second terminal of the first field effect transistor of the second type (P1) from the circuit for generating a bias voltage (GV); and wherein a first terminal of the third field effect transistor of the second type (P3) is connected to the second reference point ($V_{DD}$) and a second terminal of the third field effect transistor of the second type (P3) is connected to the summation point (S).

4. The compression amplifier according to claim 2, wherein the reference bias circuit (RVU) contains a further two quadrant multiplier (ZM'') having a preceding voltage divider and contains a feedback branch connected to the output of the further two quadrant multiplier (ZM''); wherein a further amplifier (SC') and a following feedback network (RK) are contained in the feedback branch; wherein an output of the feedback network (RK) is fed back onto the further two quadrant multiplier (ZM''); wherein the feedback network (RK) contains a third and fourth field effect transistor of the first type (N3, N4) and a fourth and fifth field effect transistor of the second type (P4, P5); wherein a first terminal of the third field effect transistor of the first type (N3), a first terminal of the fourth field effect transistor of the first type (N4) and a gate terminal of the fifth field effect transistor of the second type (P5) are connected to the first reference point ($V_{SS}$); wherein a first terminal of the fifth field effect transistor of the second type (P5) is connected to the second reference point ($V_{DD}$) and a second terminal of the fifth field effect transistor of the second type (P5) is connected to a first terminal of the fourth field effect transistor of the second type (P4); wherein a second terminal of the fourth field effect transistor of the second type (P4), a second terminal and a gate terminal of the fourth field effect transistor of the first type (N4) are connected to a gate terminal of the third field effect transistor of the first type (N3) and to the gate terminals of the first and second field effect transistor of the first type (N1, N2); wherein a second terminal of the third field effect transistor of the first type (N3) forms the output of the feedback network (RK) and a gate terminal of the fourth field effect transistor of the second type (P4) is connected to an output of the further amplifier having variable gain (SC').

5. The compression amplifier according to claim 4, wherein the two quadrant multiplier (ZM') having preceding voltage divider and the further two quadrant multiplier (ZM'') having preceding voltage divider each respectively contain: a first transconductance amplifier (TK1), a first, second, third and fourth resistor (R1, R2, R3, R4; R1, R2', R3, R4); wherein the first and second resistor (R1, R2; R1, R2') are connected in series and form the preceding voltage divider; wherein a first terminal of the voltage divider of the two quadrant multiplier (ZM') is the input the compression amplifier and a reference voltage ($U_{ref}$) is connected to a first terminal of the voltage divider of the further two quadrant multiplier (ZM''), and the second terminal of the voltage divider is connected to ground (GND); wherein a first input of the first transconductance amplifier (TK1) is connected to a center junction between the first and second resistor (R1, R2; R1, R2'); wherein an output of the first transconductance amplifier (TK1) is connected via the third resistor (R3) to a second input of the first transconductance amplifier (TK1) and is connected via the fourth resistor (R4) to ground (GND); wherein the output of the first transconductance amplifier forms the output of the two quadrant multiplier (ZM') as well as of the further two quadrant multiplier (ZM'').

6. The compression amplifier according to claim 5, wherein the second resistor (R2') in the preceding voltage divider of the further two quadrant multiplier (ZM'') has a value of resistance that is half the value of resistance of the second resistor (R2) in the preceding voltage divider of the two quadrant multiplier (ZM').

7. The compression amplifier according to claim 4, wherein the further amplifier (SC') contains a second transconductance amplifier (TK2), a third, fourth and fifth capacitor (C3, C4, C5), a first, second and third switch of a first type (S11, S12, S13) and a first, second and third switch of a second type (S21, S22, S23); Wherein the third capacitor (C3) has a capacitance value that is twice the capacitance value of the fourth capacitor; wherein the first switch of the first type (S11) is serially connected with the first switch of the second type (S21) between the output of the further two quadrant multiplier (ZM'') and ground (GND), whereby ground (GND) is connected to the first switch of the second type (S21); wherein the second switch of the first type (S12) is serially connected with the second switch of the second type (S22) between ground (GND) and a first input of the second transconductance amplifier (TK2), whereby ground (GND) is connected to the second switch of the first type (S12); wherein a third switch of the first type (S13) and a third switch of the second type (S23) are connected between ground (GND) and the reference voltage $U_{REF}$, whereby ground (GND) is connected to the third switch of the first type (S13); wherein the third capacitor (C3) is connected to a center tap between the first switch of the first type (S11) and the first switch of the second type (S21) and to a center tap between(the second switch of the first type (S12) and the second switch of the second type (S22); wherein the fourth capacitor (C4) is connected to a center tap between the third switch of the first type (S13) and the third switch of the second type (S23) and a center terminal between the second switch of the first type (S12) and a second switch of the second type (S22); wherein an output of the second transconductance amplifier (TK2) that forms an output of the further amplifier (SC') is fed back via a fifth capacitor (C5) onto the first input of the second transconductance amplifier (TK2); wherein a second input of the second transconductance amplifier (TK2) is connected to ground (GND).

8. The compression amplifier according to claim 7, wherein the switches of the first type and the switches of the second type represent transmission gates.

9. The compression amplifier according to claim 2, wherein the field effect transistors of the first type are n-channel field effect transistors and the field effect transistors of the second type are small p-channel field effect transistors and the first reference point is connected to a negative supply voltage and the second reference point is connected to a positive supply voltage.

10. The compression amplifier according to claim 2, wherein the field effect transistors of the first type are p-channel field effect transistors and the field effect transistors of the second type are n-channel field effect transistors; wherein the first reference point is connected to a positive supply voltage and the second reference point is connected to a negative supply voltage.

11. The compression amplifier according to claim 1, wherein the low-pass filter (TP') contains a second capacitor (C2), a fifth and sixth field effect transistor of a first type (N5, N6) and a sixth and seventh field effect transistor of a second type (P6, P7); wherein a first input of the sixth field effect transistor of the second type (P6) and a first input of the seventh field effect transistor of the second type (P7) are connected to a second reference point ($V_{DD}$); wherein a first terminal of the fifth field effect transistor of the first type (N5) and a first terminal of the sixth field effect transistor of the first type (N6) are connected to a first reference point ($V_{SS}$), and a gate terminal of the fifth field effect transistor of the first type (N5), a gate terminal of the sixth field effect transistor of the first type (N6) are connected in common to a second input of the sixth field effect transistor of the second type (P6) and to a second terminal of the sixth field effect transistor of the first type (N6); wherein a second terminal of the fifth field effect transistor of the first type (N5) forms the output of the low-pass filter (TP') and the second capacitor (C2) is connected between the first reference point ($V_{SS}$) and a second terminal of the seventh field effect transistor of the second type (P7); and wherein the second terminal of the seventh field effect transistor of the second type (P7) is connected to the summation point (S) and to a gate terminal of the sixth field effect transistor of the second type and to a gate terminal of the seventh field effect transistor of the second type (P6, P7).

12. The compression amplifier according to claim 11, wherein the field effect transistors of the first type are n-channel field effect transistors and the field effect transistors of the second type are small p-channel field effect transistors and the first reference point is connected to a negative supply voltage and the second reference point is connected to a positive supply voltage.

13. The compression amplifier according to claim 11, wherein the field effect transistors of the first type are p-channel field effect transistors and the field effect transistors of the second type are n-channel field effect transistors; wherein the first reference point is connected to a positive supply voltage and the second reference point is connected to a negative supply voltage.

14. The compression amplifier according to claim 1, wherein an isolating amplifier (TV) is connected between the two quadrant multiplier (ZM') and the output ($U_a'$) of the compression amplifier; wherein the isolating amplifier (TV) contains a third transconductance amplifier (TK3), a sixth, seventh and eighth capacitor (C6, C7, C8) and a fourth, fifth and sixth switch of a first type (S14, S15, S16) and a fourth, fifth and sixth switch of a second type (S24, S25, S26); wherein the fourth switch of the first type (S14) is connected between the two quadrant multiplier (ZM') and a first terminal of the sixth capacitor (C6); wherein the fourth switch of the second type (S24) is connected between the first terminal of the sixth capacitor (C6) and ground (GND); wherein a second terminal of the sixth capacitor (C6) is connected to a first terminal of the third transconductance amplifier (TK3) and the fifth switch of the first type (S15) and the fifth switch of the second type (S25) that are serially connected to one another are connected between the second terminal of the sixth capacitor (C6) and ground (GND), whereby the fifth switch of the second type (S25) is connected to ground (GND); wherein an output of the third transconductance amplifier (TK3) that forms an output of the isolating amplifier (TV) is fed back via the seventh capacitor (C7) onto a center terminal between the fifth switch of the first type (S15) and fifth switch of the second type (S25); wherein the sixth switch of the first type (S16) and the sixth switch of the second type (S26) are serially connected between ground (GND) and the output of the third transconductance amplifier (TK3), whereby the sixth switch of the first type (S16) is connected to ground (GND), and a first terminal of the eighth capacitor (C8) is connected to a center tap between the sixth switch of the first type (S16) and the sixth switch of the second type (S26) and a second terminal of the eighth capacitor (C8) is connected to the first input of the third transconductance amplifier (TK3); and wherein a second input of the third transconductance amplifier (TK3) is connected to ground (GND).

15. The compression amplifier according to claim 14, wherein the switches of the first type and the switches of the second type represent transmission gates.

16. The compression amplifier according to claim 1 wherein the amplifier having variable gain (SC) is a "switched capacitor" amplifier that contains a seventh, eighth and ninth switch of a first type (S17, S18, S19), a seventh, eighth and ninth switch of a second type (S27, S28, S29) and a first, second, third and fourth switch of a third type (S31, S32, S33, S34), a ninth, tenth, eleventh, twelfth, thirteenth and fourteenth capacitor (C9, C10, C11, C12, C13, C14) and a fourth transconductance amplifier (TK4); wherein a parallel capacitor network and a seventh switch of the second type (S27) are serially connected between a first input of the fourth transconductance amplifier (TK4) and the input of the amplifier having variable gain (SC); wherein the seventh switch of the first type (S17) is connected to the center tap between the parallel capacitor network and the seventh switch of the second type (S27) and ground (GND); wherein the parallel capacitor network contains the ninth capacitor (C9) connected in series with the first switch of the third type (S31), parallel to the tenth capacitor (C10) connected in series with the second switch of the third type (S32) parallel to the eleventh capacitor (C11) connected in series with the third switch of the third type (S33) parallel to the twelfth capacitor (C12) connected in series with the fourth switch of the fourth type (S34); wherein an output of the fourth transconductance amplifier (TK4) that simultaneously forms the output of the amplifier having variable gain (SC) is fed back onto the first input of the fourth transconductance amplifier (TK4) via a thirteenth capacitor (C13) in series with the eighth switch of the second type (S28) as well as via the ninth switch of the first type (S19) in series with the fourteenth capacitor (C14); wherein a second input of the fourth transconductance amplifier (TK4) is connected to ground (GND); wherein an eighth switch of the first type (S18) is connected between ground (GND) and a center tap between the eighth switoh of the second type (S28) and the thirteenth capacitor (C13); and wherein a ninth switch of the second type (S29) is arranged between ground (GND) and a center tap between the ninth switch of the first type (S19) and the fourteenth capacitor (C14).

17. The compression amplifier according to claim 16, wherein the switches of the first type and the switches of the second type represent transmission gates; and wherein the switches of the third type are realized as programmable on-off switches.

18. The compression amplifier according to claim 1, wherein the compression amplifier is constructed in CMOS technology.

19. A compression amplifier having a two quadrant multiplier (ZM') and a feedback branch that contains a rectifier (GR') and a following low-pass filter (TP''), whereby the feedback branch is fed back onto the two quadrant multiplier (ZM') and the two quadrant multiplier (ZM') with a preceding voltage divider is connected between an input and an output ($U_e''$, $U_a''$) of the compression amplifier, comprising an amplifier having variable gain (SC) connected in the feedback branch between the rectifier unit (GR'') and the output of the compression amplifier ($U_a''$); the rectifier unit (GR'') having a circuit for generating a bias voltage (GV') allocated to it; the low-pass filter (TP'') being fed back to the two quadrant multiplier (ZM') via a voltage-to-current converter (U/IW); and the voltage-to-current converter (U/IW) having a reference voltage source (RU) allocated to it.

20. The compression amplifier according to claim 19, wherein the circuit for generating a bias voltage (GV') contains first, second, third and fourth field effect transistors of a second type (PI', P2', P3', P4') and contains first and second field effect transistors of a first type (N1', N2'); wherein a gate terminal of the first field effect transistor of the second type (P1') and a first terminal of the first field effect transistor of the first type (N1') are connected in common to a first reference point ($V_{SS}$); wherein a first terminal of the first field effect transistor of the second type (P1') and a first terminal of the second field effect transistor of the first type (N2') are connected in common to a gate terminal of the second field effect transistor of the first type (N2'); wherein a second terminal of the second field effect transistor of the first type (N2') and a second terminal of the first field effect transistor of the first type (N1') are connected in common to a first input of the second field effect transistor of the second type (P2') and to a gate terminal of the second field effect transistor of the second type (P2'); wherein a second input of the second field effect transistor of the second type is connected to a first input of the third field effect transistor of the second type (P3') and to a gate terminal of the third and fourth field effect transistor of the second type (P3', P4'); wherein a first terminal of the second field effect transistor of the first type (N2') is connected to a first terminal of the fourth field effect transistor of the second type (P4') and a second terminal of the third field effect transistor of the second type (P3') and a second terminal of the fourth field effect transistor of the second type (P4') are connected to a second reference point ($V_{DD}$); and wherein a second terminal of the first effect transistor of the second type (P1') is connected to the rectifier unit (GR').

21. The compression amplifier according to claim 20, wherein the rectifier unit (GR'') contains a third field effect transistor of the first type (N3') and a first capacitor (C1'); wherein the first capacitor (C1') is connected between an output of the amplifier having variable gain (SC) and a gate terminal of the third field effect transistor of the first type (N3') and the second terminal of the first field effect transistor of the second type (P1') from the circuit for generating a bias voltage (GV'); and wherein a first terminal of the third field effect transistor of the first type (N3') is connected to the second reference point ($V_{DD}$) and a second terminal of the third field effect transistor of the first type (N3') is connected to the low-pass filter (TP'').

22. The compression amplifier according to claim 20, wherein the field effect transistors of the first type are n-channel field effect transistors and the field effect transistors of the second type are small p-channel field effect transistors and the first reference point is connected to a negative supply voltage and the second reference point is connected to a positive supply voltage.

23. The compression amplifier according to claim 20, wherein the field effect transistors of the first type are p-channel field effect transistors and the field effect transistors of the second type are n-channel field effect transistors; wherein the first reference point is connected to a positive supply voltage and the second reference point is connected to a negative supply voltage.

24. The compression amplifier according to claim 19, wherein the low-pass filter (TP'') contains a second capacitor (C2') and a fourth field effect transistor of a first type (N4'); wherein a first terminal of the second capacitor (C2') and a first terminal of the fourth field effect transistor of the first type (N4') are connected in common to the rectifier unit (GR'') and a second terminal of the second capacitor (C2') and a second terminal of the fourth field effect transistor of the first type (N4') are connected in common to a first reference point ($V_{SS}$) and the first terminal of the second capacitor (C2') and the first terminal of the fourth field effect transistor of the first type (N4') in common form an output of the low-pass filter (TP'').

25. The compression amplifier according to claim 24, where the field effect transistors of the first type are n-channel field effect transistors and the field effect transistors of the second type are small p-channel field effect transistors and the first reference point is connected to a negative supply voltage and the second reference point is connected to a positive supply voltage.

26. The compression amplifier according to claim 24, wherein the field effect transistors of the first type are p-channel field effect transistors and the field effect transistors of the second type are n-channel field effect transistors; wherein the first reference point is connected to a positive supply voltage and the second reference point is connected to a negative supply voltage.

27. The compression amplifier according to claim 19, wherein the voltage-to-current converter (U/IW) contains a fifth, sixth and seventh field effect transistor of a first type (N5', N6', N7') and a fourth, fifth and sixth field effect transistor of a second type (P4', P5', P6'); wherein a first terminal of the fifth field effect transistor of the first type (N5'), a first terminal of the sixth field effect transistor of the first type (N6') and a first terminal of the seventh field effect transistor of the first type (N7') are connected in common to a first reference point ($V_{SS}$); wherein a first terminal of the fourth field effect transistor of the second type (P4') and a first terminal of the fifth field effect transistor of the second type (P5') are connected to a second reference point ($V_{DD}$); wherein a gate terminal of the sixth field effect transistor of the first type (N6') and a gate terminal of the seventh field effect transistor of the first type (N7') are connected in common to a second terminal of the seventh field effect transistor of the first type (N7') and to a second terminal of the fourth field effect transistor of the second type (P4'); wherein a gate terminal of the fourth field effect transistor of the second type (P4') and a gate terminal of the fifth field effect transistor of the second type (P5') are connected in common to a second input of the fifth effect transistor of the second type (P5') and to a first input of the sixth field effect transistor of the second type (P6'); wherein a second terminal of the sixth field effect transistor of the second type (P6') is connected to a second terminal of the fifth field effect transistor of the first type (N5'); wherein a gate terminal of the sixth field effect transistor of the second type (P6') is connected to the low-pass filter (TP') and a second terminal of the sixth field effect transistor of the first type (N6') is fed back onto the two quadrant multiplier (ZM').

28. The compression amplifier according to claim 27, in the reference voltage source (RU) contains a further two quadrant multiplier (ZM") having preceding voltage divider and a feedback branch connected to the output of the further two quadrant multiplier (ZM"); wherein a further amplifier (SC') and a following feedback network (RK') are connected in the feedback branch; wherein an output of the feedback network (RK') is fed back onto the further two quadrant multiplier (ZM"); wherein the feedback network (RK') contains an eighth, ninth and tenth field effect transistor of the first type (N8', N9', N10') and a seventh, eighth, ninth and tenth field effect transistor of the second type (P7', P8', P9', P10'); wherein a first terminal of the eight field effect transistor of the first type (N8'), a first terminal of the ninth field effect transistor of the first type (N9'), a first terminal of the tenth field effect transistor of the first type (N10') and a gate terminal of the tenth field effect transistor of the second type (P10') are connected in common to the first reference point ($V_{SS}$); wherein a gate terminal of the eighth field effect transistor of the first type (N8') and a gate terminal of the ninth field effect transistor of the first type (N9') are connected in common to a second terminal of the ninth field effect transistor of the first type (N9') and to a first terminal of the seventh field effect transistor of the second type (P7'); wherein a second terminal of the seventh field effect transistor of the second type (P7') is connected to a first terminal of the eighth field effect transistor of the second type (P8') and in common to the second reference point ($V_{DD}$); wherein a gate terminal of the seventh field effect transistor of the second type (P7') and a gate terminal of the eighth field effect transistor of the second type (P8') are connected in common to a second terminal of the eighth field effect transistor of the second type (P8') and to a first terminal of the ninth field effect transistor (P9') of the second type; wherein a second terminal of the ninth field effect transistor of the second type (P9') is connected to a first terminal of the tenth field effect transistor of the second type (P10') and a second terminal of the tenth field effect transistor of the second type (P10') and second terminal of the tenth field effect transistor of the first type (N10') are connected in common to a gate terminal of the tenth field effect transistor of the first type (N10'); wherein a second terminal of the eighth field effect transistor of the first type (N8') forms the output of the feedback network (RK'); wherein a gate terminal of the ninth field effect transistor of the second type (P9') is connected to an output of the further amplifier (SC'); wherein the gate terminal of the tenth field effect transistor of the first type (N10') is connected to the gate terminal of the first field effect transistor of the first type (N1'), to the gate terminal of the fourth field effect transistor of the first type (N4') and to the gate terminal of the fifth field effect transistor of the first type (N5').

29. The compression amplifier according to claim 11, wherein the two quadrant multiplier (ZM') having preceding voltage divider and the further two quadrant multiplier (ZM") having preceding voltage divider each respectively contain a first transconductance amplifier (TK1), a first, second, third and fourth resistor (R1, R2, R3, R4; R1, R2', R3, R4); wherein the first and second resistor (RI, R2, R1, R2') are connected in series and form the preceding voltage divider; wherein a first terminal of the voltage divider of the two quadrant multiplier (ZM') is the input ($U_e''$) of the compression amplifier and a reference voltage ($U_{ref}$) is connected to a first terminal of the voltage divider of the further two quadrant multiplier (ZM"), and the second terminal of the voltage divider is connected to ground (GND); wherein a first input of the first transconductance amplifier (TK1) is connected to a center junction between the first and second resistor (R1, R2, R1, R2'); wherein an output of the first transconductance amplifier (TK1) is connected via the third resistor (R3) to a second input of the first transconductance amplifier (TK1) and is connected via the fourth resistor (R4) to ground (GND); wherein the output of the first transconductance amplifier forms the output of the two quadrant multiplier (ZM') as well as of the further two quadrant multiplier (ZM").

30. The compression amplifier according to claim 29, wherein the second resistor (R2') in the preceding voltage divider of the further two quadrant multiplier (ZM") has a value of resistance that is half the value of resistance of the second resistor (R2) in the preceding voltage divider of the two quadrant multiplier (ZM').

31. The compression amplifier according to claim 28, wherein the further amplifier (SC') contains a second transconductance amplifier (TK2), a third, fourth and fifth capacitor (C3, C4, C5), a first, second and third switch of a first type (S11, S12, S13) and a first, second and third switch of a second type (S21, S22, S23); wherein the third capacitor (C3) has a capacitance value that is twice the capacirance value of the fourth capacitor; wherein the first switch of the first type (S11) is serially connected with the first switch of the second type (S21) between the output of the further two quadrant multiplier (ZM") and ground (GND), whereby ground (GND) is connected to the first switch of the second type (S21); wherein the second switch of the first type (S12) is serially connected with the second switch of the second type (S22) between ground (GND) and a first input of the second transconductance amplifier (TK2), whereby ground (GND) is connected to the second switch of the first type (S12); wherein a third switch of the first type (S13) and a third switch of the second type (S23) are connected between ground (GND) and a reference voltage $U_{REF}$, whereby ground (GND) is connected to the third switch of the first type (S13); wherein the third capacitor (C3) is connected to a center tap between the first switch of the first type (S11) and the first switch of the second type (S21) and to a center tap between the second switch of the first type (S12) and the second switch of the second type (S22); herein the fourth capacitor (C4) is connected to a center tap between the third switch of the first type (S13) and the third switch of the second type (S23) and the center terminal between the second switch of the first type (S12) and a second switch of the second type (S22); wherein an output of the second transconductance amplifier (TK2) that forms an output of the further amplifier (ST') is fed back via a fifth capacitor (C5) onto the first input of the second transconductance amplifier (TK2); wherein a second input of the second transconductance amplifier (TK2) is connected to ground (GND).

32. The compression amplifier according to claim 31, wherein the switches of the first type and the switches of the second type represent transmission gates.

33. The compression amplifier according to claim 27, wherein the field effect transistors of the first type are n-channel field effect transistors and the field effect transistors of the second type are small p-channel field effect transistors and the first reference point is connected to a negative supply voltage and the second reference point is connected to a positive supply voltage.

34. The compression amplifier according to claim 27, wherein the field effect transistors of the first type are p-channel field effect transistors and the field effect transistors of the second type are n-channel field effect transistors; wherein the first reference point is connected to a positive supply voltage and the second reference point is connected to a negative supply voltage.

35. The compression amplifier according to claim 19, wherein an isolating amplifier (TV) is connected between the two quadrant multiplier (ZM') and the output (U'''') of the compression amplifier; wherein the isolating amplifier (TV) contains a third transconductance amplifier (TK3), a sixth, seventh and eighth capacitor (C6, C7, C8) and a fourth, fifth and sixth switch of a first type (S14, S15, S16) and a fourth, fifth and sixth switch of a second type (S24, S25, S26); wherein the fourth switch of the first type (S14) is connected between the two quadrant multiplier (ZM') and a first terminal of the sixth capacitor (C6); wherein the fourth switch of the second type (S24) is connected between the first terminal of the sixth capacitor (C6) and ground (GND); wherein a second terminal of the sixth capacitor (C6) is connected to a first terminal of the third transconductance amplifier (TK3) and the fifth switch of the first type (S15) and the fifth switch of the second type (S25) that are serially connected to one another are connected between the second terminal of the sixth capacitor (C6) and ground (GND), whereby the fifth switch of the second type (S25) is connected to ground (GND); wherein an output of the third transconductance amplifier (TK3) that forms an output of the isolating amplifier (TV) is fed back via the seventh capacitor (C7) onto a center terminal between the fifth switch of the first type (S15) and fifth switch of the second type (S25); wherein the sixth switch of the first type (S16) and the sixth switch of the second type (S26) are serially connected between ground (GND) and the output of the third transconductance amplifier (TK3), whereby the sixth switch of the first type (S16) is connected to ground (GND), and a first terminal of the eighth capacitor (C8) is connected to a center tap between the sixth switch of the first type (S16) and the sixth switch of the second type (S26) and a second terminal of the eighth capacitor (C8) is connected to the first input of the third transconductance amplifier (TK3); and wherein a second input of the third transconductance amplifier (TK3) is connected to ground (GND).

36. The compression amplifier according to claim 35, wherein the switches of the first type and the switches of the second type represent transmission gate.

37. The compression amplifier according to claim 19, wherein the amplifier having variable gain (SC) is a "switched capacitor" amplifier that contains a seventh, eighth and ninth switch of a first type (S17, S18, S19), a seventh, eighth and ninth switch of a second type (S27, S28, S29) and a first, second, third and fourth switch of a third type (S31, S32, S33, S34), a ninth, tenth, eleventh, twelfth, thirteenth and fourteenth capacitor (C9, C10, C11, C12, C13, C14) and a fourth transconductance amplifier (TK4); wherein a parallel capacitor network and a seventh switch of the second type (S27) are serially connected between a first input of the fourth transconductance amplifier (TK4) and the input of the amplifier having variable gain (SC); wherein the seventh switch of the first type (S17) is connected to the center tap between the parallel capacitor network and the seventh switch of the second type (S27) and ground (GND); wherein the parallel capacitor network contains the ninth capacitor (C9) connected in series with the first switch of the third type (S31), parallel to the tenth capacitor (C10) connected in series with the second switch of the third type (S32) parallel to the eleventh capacitor (C11) connected in series with the third switch of the third type (S33) parallel to the twelfth capacitor (C12) connected in series with the fourth switch of the fourth type (S34); wherein an output of the fourth transconductance amplifier (TK4) that simultaneously forms the output of the amplifier having variable gain (SC) is fed back onto the first input of the fourth transconductance amplifier (TK4) via a thirteenth capacitor (C13) in series with the eighth switch of the second type (S28) as well as via the ninth switch of the first type (S19) in series with the fourteenth capacitor (C14); wherein a second input of the fourth transconductance amplifier (TK4) is connected to ground (GND); wherein an eighth switch of the first type (S18) is connected between ground (GND) and a center tap between the eighth switch of the second type (S28) and the thirteenth capacitor (C13); and wherein a ninth switch of the second type (S29) is arranged between ground (GND) and a center tap between the ninth switch of the first type (S19) and the fourteenth capacitor (C14).

38. The compression aplifier according to claim 37, wherein the switches of the first type and the switches of the second type represent transmission gates; and wherein the switches of the third type are realized as programmable on-off switches.

39. The compression amplifier according to claim 19, wherein the compression amplifier is constructed in CMOS technology.

* * * * *